United States Patent
Shima-Edelstein et al.

(10) Patent No.: US 11,843,043 B2
(45) Date of Patent: Dec. 12, 2023

(54) METHOD OF FORMING A GAN SENSOR HAVING A CONTROLLED AND STABLE THRESHOLD VOLTAGE IN THE SENSING AREA

(71) Applicant: Tower Semiconductor Ltd., Migdal Haemek (IL)

(72) Inventors: Ruth Shima-Edelstein, Haifa (IL); Ronen Shaul, Haifa (IL); Roy Strul, Naharia (IL); Anatoly Sergienko, Kyriat Yam (IL); Liz Poliak, Nesher (IL); Ido Gilad, Nesher (IL); Alex Sirkis, Yokneam Ilit (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 215 days.

(21) Appl. No.: 17/519,319

(22) Filed: Nov. 4, 2021

(65) Prior Publication Data

US 2022/0059675 A1    Feb. 24, 2022

Related U.S. Application Data

(63) Continuation of application No. 16/781,272, filed on Feb. 4, 2020, now Pat. No. 11,195,933.

(51) Int. Cl.
*H01L 29/778* (2006.01)
*H01L 29/66* (2006.01)
(Continued)

(52) U.S. Cl.
CPC ............. *H01L 29/66462* (2013.01); *H01L 21/823462* (2013.01); *H01L 29/2003* (2013.01);
(Continued)

(58) Field of Classification Search
None
See application file for complete search history.

(56) References Cited

U.S. PATENT DOCUMENTS 9,570,600 B2    2/2017  Lu et al.
2011/0272742 A1*  11/2011  Akiyama .......... H01L 29/41725
                                                    257/E21.403
(Continued)

FOREIGN PATENT DOCUMENTS

WO    2018069553 A1    4/2018

OTHER PUBLICATIONS

Anderson, Travis, et al., article entitled "Advances In Hydrogen, Carbon Dioxide, and Hydrocarbon Gas Sensor Technology Using GaN and ZnO-Based Devices", Sensors 2009, ISSN 1424-8220 (www.mdpi.com/journal/sensors); 26 pages.
(Continued)

*Primary Examiner* — Grant S Withers
(74) *Attorney, Agent, or Firm* — Bever, Hoffman & Harms, LLP

(57) ABSTRACT

A method fabricating a GaN based sensor including: forming a gate dielectric layer over a GaN hetero-structure including a GaN layer formed over a substrate and a first barrier layer formed over the GaN layer; forming a first mask over the gate dielectric layer; etching the gate dielectric layer and the first barrier layer through the first mask, thereby forming source and drain contact openings; removing the first mask; forming a metal layer over the gate dielectric layer, wherein the metal layer extends into the source and drain contact openings; forming a second mask over the metal layer; etching the metal layer, the gate dielectric layer and the GaN heterostructure through the second mask, wherein a region of the GaN heterostructure is exposed; and thermally activating the metal layer in the source and drain contact openings. The gate dielectric may
(Continued)

exhibit a sloped profile, and dielectric spacers may be formed.

33 Claims, 30 Drawing Sheets

(51) Int. Cl.
    *H01L 21/8234*     (2006.01)
    *H01L 29/205*     (2006.01)
    *H01L 29/20*     (2006.01)
    *H01L 29/40*     (2006.01)
    *H01L 29/417*     (2006.01)

(52) U.S. Cl.
    CPC .......... *H01L 29/205* (2013.01); *H01L 29/401* (2013.01); *H01L 29/41766* (2013.01); *H01L 29/7786* (2013.01); *H01L 29/7787* (2013.01)

(56) References Cited

U.S. PATENT DOCUMENTS

| | | | |
|---|---|---|---|
| 2019/0170738 | A1 | 6/2019 | Ren et al. |
| 2019/0267467 | A1 | 8/2019 | Yoshimochi |

OTHER PUBLICATIONS

Dowling, Karen M., et al. article entitled "Micro-Tesla Offset in Thermally Stable AlGaN/GaN 2DEG Hall-effect Plates using Current Spinning", published in IEEE Sensors Letter, vol. 3, Issue 3, Mar. 2019, 6 pages.

Eickhoff, M, et al. article entitled "Electronics and sensors based on pyroelectric AlGaN/ heterostructures", phys. stat. sol. (c) O, No. 6, 1908-1918 (2003, 11 pages.

Halfaya, Yacine et al., article entitled "Investigation of the Performance of HEMT-Based NO, No2 and NH3 Exhaust Gas Sensors for Automotive Antipollution Systems", Sensors 2016, 16,273; doi:10.3390/s16030273 (www.mdpi.com/journal/sensors), 12 pages.

Hou, Minmin et al., article entitled "Suppression of Persistent Photoconductivity AlGaN/GaN Ultraviolet Photodetectors Using In Situ Heating", IEEE Electron Device Letters, vol. 38, No. 1, Jan. 2017, 4 pages.

Hung, S.C., et al. article entitled "Detection of chloride ions using an integrated Ag/AgCl electrode with AlGaN/GaN high electron mobility transistors", Appl. Phys. Lett. 92, 193903 (2008, 4 pages.

Iskierko, Zofia et al., article entitled "Molecular recognition by synthetic receptors: Application in field-effect transistor based chemosensing", Biosensors and Bioelectronics 109 (2018), 13 pages.

Offermans, Peter, article entitled "Exposing Pollutants With GaN HEMTs", Sep. 30, 2016, appeared in Compound Semiconductor magazine, 11 pages.

Ren, Fan et al., article entitled "AlGaN/GaN High Electron Mobility Transistor Based Sensors for Bio-Applications", published Jul. 19, 2011, 55 pages (www.intechopen.com).

Suria, Ateeq et al., article entitled "2DEG-Heated AlGaN/GaN Micro-Hotplates for High-Temperature Chemical Sensing Microsystems", https//:www.researchgate.net/publication/304115246, Conference Paper Jun. 2016, 5 pages.

Vitushinsky, R. et al., article entitled "AlGaN Ultrathinned 2DEG Structures For. . . ", WOCSDICE 2011—Catania (Ital), May 29-Jun. 1, 2011, 2 pages.

White, Thomas P., et al. article entitled "AlGAn/GaN Micro-Hall Effect Devices for Simultaneous Current and Temperature Measurements From Line Currents", IEEE Sensors Journsel, vol. 18, No. 7, Apr. 1, 2018, 8 pages.

\* cited by examiner

METHOD OF FORMING A GAN SENSOR HAVING A CONTROLLED AND STABLE THRESHOLD VOLTAGE IN THE SENSING AREA

RELATED APPLICATIONS

This application is a continuation of U.S. patent application entitled "METHOD OF FORMING A GaN SENSOR HAVING A CONTROLLED AND STABLE THRESHOLD VOLTAGE IN THE SENSING AREA", U.S. application Ser. No. 16/781,272, filed Feb. 4, 2020.

FIELD OF THE INVENTION

The present invention relates to an AlGaN/GaN sensor having a metal-insulator-semiconductor (MIS) high electron-mobility transistor (HEMT) structure with improved isolation between the gate and AlGaN open surface regions, thereby providing a stable device with threshold voltage (Vt) control of the sensing area.

RELATED ART

AlGaN/GaN high electron mobility transistors (HEMTs) are currently primarily used for power management and radio frequency (RF) applications, which benefit from high breakdown fields and high two-dimensional electron gas (2DEG) mobility provided by GaN transistors. There is growing interest in the use of such HEMT hetero-structures for sensing applications due to the robustness of this material system in extreme conditions (pressure, temperature, corrosive, radiation), especially when compared to conventional silicon-based devices. There are numerous examples of sensing applications that use 2DEG resistance changes in simple systems consisting of contacts to the 2DEG, and exposed sensor surfaces. Some prominent examples include: Hall sensors (as described by Karen M. Dowling et al., in "Micro-Tesla Offset in Thermally Stable AlGaN/GaN 2DEG Hall-effect Plates using Current Spinning", IEEE Sensors Letters, Vol. 3, Issue 3, March 2019), temperature sensors (as described by Thomas P. White et al., in "AlGaN/GaN Micro-Hall Effect Devices for Simultaneous Current and Temperature Measurements From Line Currents", IEEE Sensors Journal, Vol. 18, No. 7, Apr. 1, 2018), and chemical sensors (as described by Zofia Iskierko et al., in "Molecular Recognition by Synthetic Receptors: Application in Field-Effect Transistor Based Chemosensing", Biosensors and Bioelectronics, Vol. 109, 30 Jun. 2018, Pages 50-62; S. C. Hung et al., in "Detection of Chloride Ions Using an Integrated Ag/AgCl Electrode with AlGaN/GaN High Electron Mobility Transistors", Applied Physics Letters 92, 14 May 2008; M. Eickhoff et al., in "Electronics and Sensors Based on Pyroelectric AlGaN/GaN Heterostructures" Phys. Stat. Sol. (c) 0, No. 6, 1908-1918 (2003); Fan Ren et al., in "AlGaN/GaN High Electron Mobility Transistor Based Sensors for Bio-Applications, Biosensors for Health, Environment and Biosecurity" ISBN: 978-953-307-443-6, InTech; and R. Vitushinsky et al., in "AlGaN Ultrathinned 2DEG structures for NOx sensing", WOCSDICE 2011-Catania (Italy), May 29-Jun. 1, 2011).

FIG. 1 is a cross sectional view of a conventional 2DEG-based sensor 100, which includes silicon wafer 101, nucleation layer 110, GaN buffer layer 102, 2DEG channel 103, AlGaN layer 104, and ohmic contacts 105-106. AlGaN layer 104 is recessed in region 104A, thereby providing an open AlGaN sensing area having a thickness of about 6 to 7 nm. Sensor 100 exhibits high drain currents (e.g., in the mA range), but the sensitivity to external influences is low. By employing transistor configurations (i.e., adding gate electrodes) and observing changes at the subthreshold region of current, sensitivity to external influences may be increased. Several Schottky type AlGaN/GaN HEMI sensors have been reported, especially for gas sensing applications, wherein a gate electrode also enables selectivity for specific gas types using materials such as platinum (Pt) and palladium (Pd) (Travis Anderson et al., "Advances in Hydrogen, Carbon Dioxide, and Hydrocarbon Gas Sensor Technology Using GaN and ZnO-Based Devices", Sensors 2009, 9, 4669-4694; Fan Ren et al., "Low Cost Disposable Medical Sensor Fabricated on Glass, Paper, or Plastics", Published U.S. Patent Application 2019/0170738 A1, Jun. 6, 2019; Yacine Halfaya et al., "Investigation of the Performance of HEMT-Based NO, NO2 and NH3 Exhaust Gas Sensors for Automotive Antipollution Systems" Sensors 2016, 16, 273; Aubry, Vincent "Detection Sensor Comprising A Selective High-Electron-Mobility Transistor for Detecting a Gaseous or Liquid Component", WO 2018/069553 Al 19 Apr. 2018).

Metal-insulator-semiconductor (MIS) gate structures may also offer increased sensitivity in subthreshold current regime. When compared to Schottky-type gate structures, MIS gate structures offer suppressed gate leakage, smaller gate swing values, and more scalable threshold voltages. The advantage of using MIS gate structures is that integration is simple, and fab friendly materials like titanium and aluminum can be used. However, one of the main challenges in the formation of sensors that implement MIS gate structures is the realization of a controlled and stable system such that changes in device threshold voltage (Vt) are related only to external influences and not to non-uniformities of the manufacturing process.

Three components of the manufacturing process may result in non-uniformities. A first component relates to the gate metal edge profile, and the prevention of leakage paths between the metal gate and the 2DEG channel. A second component is related to control of 2DEG carrier density in the sensing area. A known technique of sensitivity enhancement is recessing the AlGaN barrier layer in the sensing area. This results in decreasing the HEMT transistor threshold voltage (Vt) and bringing the device into a regime similar to subthreshold operation of a MOS transistor. However, a main obstacle of this technique is difficulty in controlling the recess process uniformity, and consequently, the device threshold voltage.

A third component impacting sensor threshold voltage stability is related to sensor condition regeneration in order to enable monitoring of external influences in real time without artifacts. A tungsten (W) based heater has been provided on a GaN membrane to regenerate the surface of a gas sensor after adsorption of exhaust gases, such as NO, $NO_2$ and $NH_3$, in automotive applications. (Peter Offermans, IMEC, Compound Semiconductor, 30 Sep. 2016.) This concept undesirably requires additional steps of tungsten deposition, lithography and etch, which make sensor manufacturing more complex.

2DEG resistors have also been used for heating a GaN membrane. (See, e.g., M. Hou et al., "2DEG-Heated AlGaN/GaN Micro-Hotplates for High-Temperature Chemical Sensing Microsystems", Solid-State Sensors, Actuators and Microsystems Workshop, Hilton Head Island, S.C., Jun. 5-9, 2016.) More specifically, a 2DEG resistor/heater has been used to regenerate a UV sensor and overcome persistent photo conductivity phenomena. (See, e.g., M. Hou, "Suppression of Persistent Photoconductivity in AlGaN/GaN Ultraviolet Photodetectors Using in Situ Heating", IEEE Electron Device Letters, Vol. 38, No. 1, January 2017.) In this case, a GaN membrane is formed by etching a GaN stack from the wafer front side, and subsequently using a $XeF_2$ vapor etch (also from the wafer front side) to remove a portion the underlying silicon substrate through openings formed through the etched GaN stack. The disadvantage of this approach is process control. The GaN stack needs to be fully and uniformly etched in order to control the subsequent silicon etch process. Furthermore, the silicon etch is a timed process, and depth of the cavity formed in the silicon may vary.

It would therefore be desirable to have an improved AlGaN/GaN environmental sensor with a controlled and stable threshold voltage (Vt). It would further be desirable to have efficient methods for fabricating such a sensor.

SUMMARY

Accordingly, the present invention provides a method for fabricating an AlGaN/GaN sensor that includes forming a gate dielectric layer over a GaN hetero-structure that includes a GaN layer formed over a substrate, a first AlGaN barrier layer formed over the GaN layer, and a 2 dimensional electron gas (2DEG) channel is formed at an upper surface of GaN layer, adjacent to the first barrier layer.

A first mask is formed over the gate dielectric layer, wherein the first mask includes first openings that define locations of the source and drain contact regions of the sensor. The gate dielectric layer and the first AlGaN barrier layer are etched through the first openings in the first mask, thereby forming source and drain contact openings. After the first mask is removed, a metal layer is formed over the resulting structure, wherein portions of the metal layer extend into the source and drain contact openings and other portions of the metal layer extend over the gate dielectric layer. A second mask is formed over the metal layer, wherein the second mask covers the regions where the source and drain contacts are to be formed, as well as the regions where gate electrodes are to be formed. The metal layer, the gate dielectric layer and the GaN hetero-structure are etched through the second mask, whereby at least one region of the GaN hetero-structure is exposed. The metal layer is thermally activated (e.g., by a rapid thermal process), such that the metal in the source and drain contact openings comes into contact with the 2DEG channel in the GaN layer.

In one embodiment, etching the metal layer forms a source contact in the source contact opening, a drain contact in the drain contact opening, and a plurality of metal gate electrodes that extend over the 2DEG channel between the source contact and the drain contact. The exposed region of the GaN hetero-structure is located in a gap between the metal gate electrodes, and extends between the source contact and metal drain contact. In this embodiment, the sensor has a MIS HEMT structure.

In one embodiment, etching the GaN heterostructure through the second mask includes etching only partially through the first AlGaN barrier layer.

In an alternate embodiment, the GaN hetero-structure additionally includes an etch stop layer formed over the first AlGaN barrier layer, and a second AlGaN barrier layer formed over the etch stop layer. In this alternate embodiment, etching the GaN heterostructure through the second mask includes performing an etch that removes portions of the second AlGaN barrier layer exposed through the second mask, wherein the etch is stopped on the etch stop layer. In this embodiment, the etch stop layer has a different composition than the first and second AlGaN barrier layers, allowing for etch selectivity. For example, the first and second AlGaN barrier layers may have a composition of $Al_xGa_yN$, wherein $0<x$ and $y<1$, while the etch stop layer may have a composition of $Al_xGa_yN$, wherein $0.5<x\leq1$, and $0\leq y<0.5$. In this embodiment, the initial fabricated thickness of the first AlGaN barrier layer remains in the final sensor structure, advantageously providing good control over the thickness of the AlGaN sensing region in the final sensor structure.

In one embodiment, the metal layer has an etch profile that is vertical with respect to the upper surface of the first AlGaN barrier layer, but the etch of the gate dielectric layer is controlled such that the gate dielectric layer has an etch profile that is sloped with respect to the upper surface of the first AlGaN barrier layer. As a result, the edges of the remaining gate dielectric regions are not vertical, but rather, are sloped at an acute angle with respect to the upper surface of the first AlGaN barrier layer. In a particular embodiment, this acute angle is greater than 20 degrees. In an alternate embodiment, this acute angle is less than 70 degrees. In yet another embodiment, this acute angle is greater than 70 degrees. These sloped edges of the remaining gate dielectric regions advantageously increase the distance (and the amount of dielectric material present) between the edges of the remaining metal structures and the exposed regions of the GaN hetero-structure. This advantageously reduces current leakage from the gate electrodes to the underlying 2DEG channel, thereby maintaining a stable transistor structure.

In one embodiment, dielectric spacers are formed on the sidewalls of the remaining metal structures, as well as the sidewalls of the gate dielectric regions. These dielectric spacers extend from the sidewalls of the remaining metal structures (i.e., source contact, drain contact and gate electrodes) to the GaN heterostructure (e.g., the first AlGaN barrier layer or the etch stop layer). As a result, these dielectric spacers advantageously increase the distance (and the amount of dielectric material present) between the edges of the remaining metal structures and the exposed regions of the GaN heterostructure. Again, this advantageously reduces current leakage from the gate electrodes to the underlying 2DEG channel, thereby maintaining a stable transistor structure.

In accordance with another embodiment, the back side surface of the substrate is etched, thereby defining a membrane region of the sensor. The back side of the substrate is etched by: (1) forming a mask over the back side of the substrate, wherein the mask includes an opening that defines the membrane region of the sensor, (2) performing a dry etch through the opening of the mask, wherein the dry etch extends only partially through the substrate; and then, (3) performing a wet etch through the opening of the mask, wherein the wet etch extends entirely through the substrate. This wet etch advantageously avoids plasma damage to structures fabricated at the front side of the sensor, including the gate dielectric structures.

In one embodiment, a 2DEG resistor is fabricated in the GaN layer, wherein the 2DEG resistor is located in the membrane region of the sensor. Current is passed through the 2DEG resistor, thereby generating heat that is transferred to the 2DEG channel, thereby implementing thermal refresh of the sensor.

In another embodiment, a functionalization layer is formed on the exposed region of the GaN heterostructure, wherein the functionalization layer aids in the detection of an external influence.

The present invention will be more fully understood in view of the following description and drawings.

DETAILED DESCRIPTION

Figure 1:
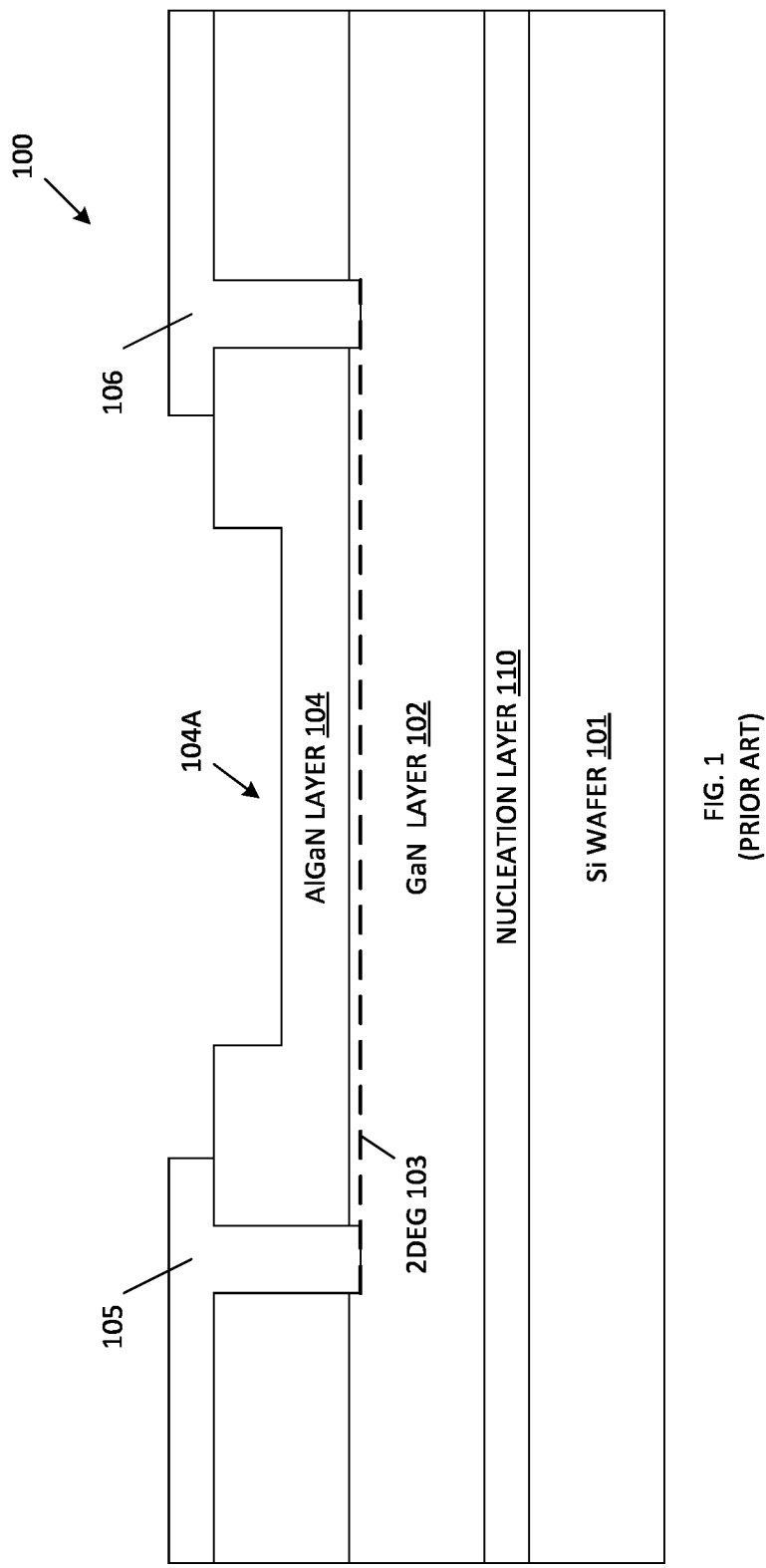
FIG. 1 is a cross sectional view of a conventional GaN/AlGaN sensor having a thinned AlGaN layer.
Figure 2A:
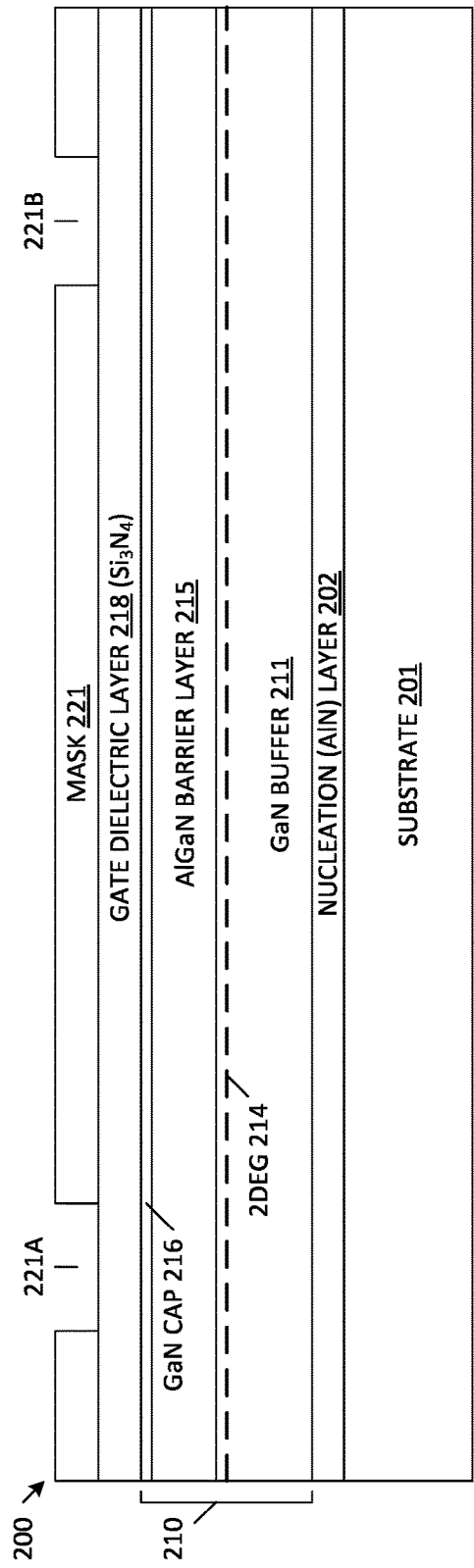
FIGS. 2A, 2B, 2C, 2D, 2E, 2F, 2G, 2H, 2I, 2J and 2K are cross sectional views of a GaN sensor, which includes a gate dielectric having a sloped profile, during various processing steps in accordance with one embodiment of the present invention.

FIGS. 2A-2K are cross sectional views of a GaN sensor 200 that includes a gate dielectric having a sloped profile during various processing steps in accordance with one embodiment of the present invention. As illustrated by FIG. 2A, sensor 200 is fabricated on a substrate 201. In the described embodiments, substrate 201 is high resistance monocrystalline silicon (having a <111> crystal orientation), advantageously reducing the costs associated with fabricating sensor 200. However, in other embodiments, substrate 201 can be sapphire, silicon carbide (SiC), or a flexible material. Nucleation layer 202 is formed on the upper surface of substrate 201. In the described embodiments, nucleation layer 202 is aluminum nitride (AlN). The nucleation layer 202 is selected to compensate for the mismatch of lattice constants between the substrate 201 and the subsequently formed gallium nitride (GaN) buffer 211. GaN buffer 211 includes one or more GaN layers, which may be interleaved with one or more stress relief layers (e.g., alternating AlGaN layers). The upper surface of GaN buffer 211 is a GaN layer.

A GaN heterostructure 210, which includes GaN buffer 211, aluminum gallium nitride (AlGaN) layer 215, and GaN cap layer 216, is formed over nucleation layer 202. More specifically, GaN buffer 211 is formed on the nucleation layer 202 using MOCVD epitaxy. In a particular embodiment, GaN buffer 211 has a thickness in the range of about 1 to 5 microns, and exhibits a resistance in the range of about 1-5 MOhm/sq. Other thicknesses and resistances are possible in other embodiments.

An AlGaN barrier layer 215 is formed on top of the GaN buffer 211. In one embodiment, AlGaN barrier layer 215 has a thickness of about 10-30 nm, and an Al content of 10-50%. A 2DEG channel 214 is formed at the upper surface of GaN buffer 211, adjacent to the AlGaN barrier layer 215. The formation of 2DEG channel 214 is a result of (i) band diagram of AlGaN—GaN potential well for electrons due to mismatch of conduction band edges, and (ii) piezoelectric polarization and the resulting high electric field in the AlGaN barrier layer. In one embodiment, 2DEG channel 214 is formed during the stack growth-MOCVD process, and has a thickness in the range of about 5 to 30 A (Angstroms) and a sheet resistance of about 500 Ohm/sq.

An optional AlN layer (not shown), having a thickness of 1-2 nm, can be formed between GaN buffer 211 and AlGaN barrier layer 215 in order to tune the conductivity of the 2DEG channel 214. The addition of such an AlN layer increases the conductivity of the 2DEG channel 214.

GaN cap layer 216 is formed over AlGaN barrier layer 215. In one embodiment, GaN cap layer 216 has a thickness of 1 to 5 nm. GaN cap layer 216 protects AlGaN barrier layer 115 from oxidation in the process flow.

A gate dielectric layer 218, having a thickness in the range of about 100 to 1000 Angstroms, is formed over GaN cap layer 216. In one embodiment, gate dielectric layer 218 is silicon nitride. In other embodiments, gate dielectric layer 218 can include other dielectric materials, such as silicon oxide, silicon oxynitride, aluminum oxide or hafnium oxide. In accordance with one embodiment, gate dielectric layer 218 is formed in situ during the MOCVD process (i.e., in the same deposition chamber used to fabricate GaN buffer 211, AlGaN barrier layer 215 and GaN cap layer 216). In an alternate embodiment, gate dielectric layer 218 is deposited ex situ (in an external tool) during device integration.

A photoresist mask 221 is formed over gate dielectric layer 218, wherein this mask 221 includes openings 221A and 221B that define the locations where a source contact and a drain contact of the sensor 200 are to be formed.

Figure 2B:
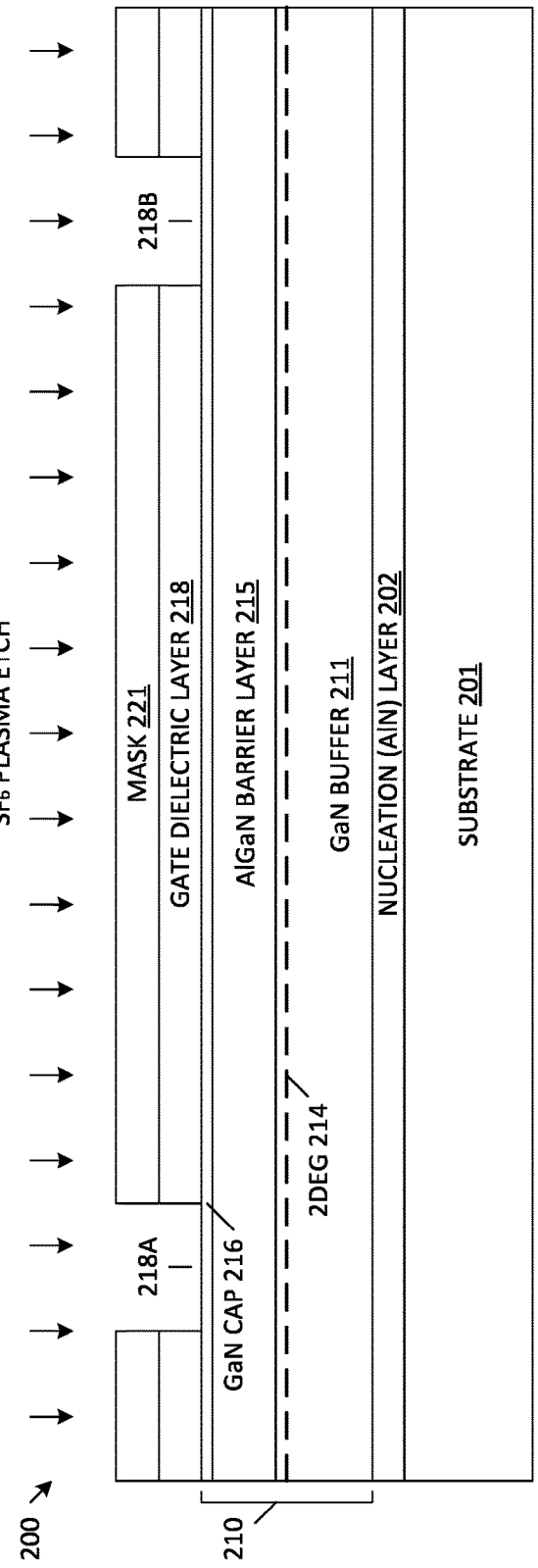

As illustrated by FIG. 2B, an $SF_6$ plasma etch is performed through the openings 221A-221B of mask 221, wherein this etch removes exposed portions of the silicon nitride gate dielectric layer 218, thereby forming corresponding openings 218A-218B through gate dielectric layer 218. This etch exposes portions of the upper surface of GaN cap layer 216.

Figure 2C:
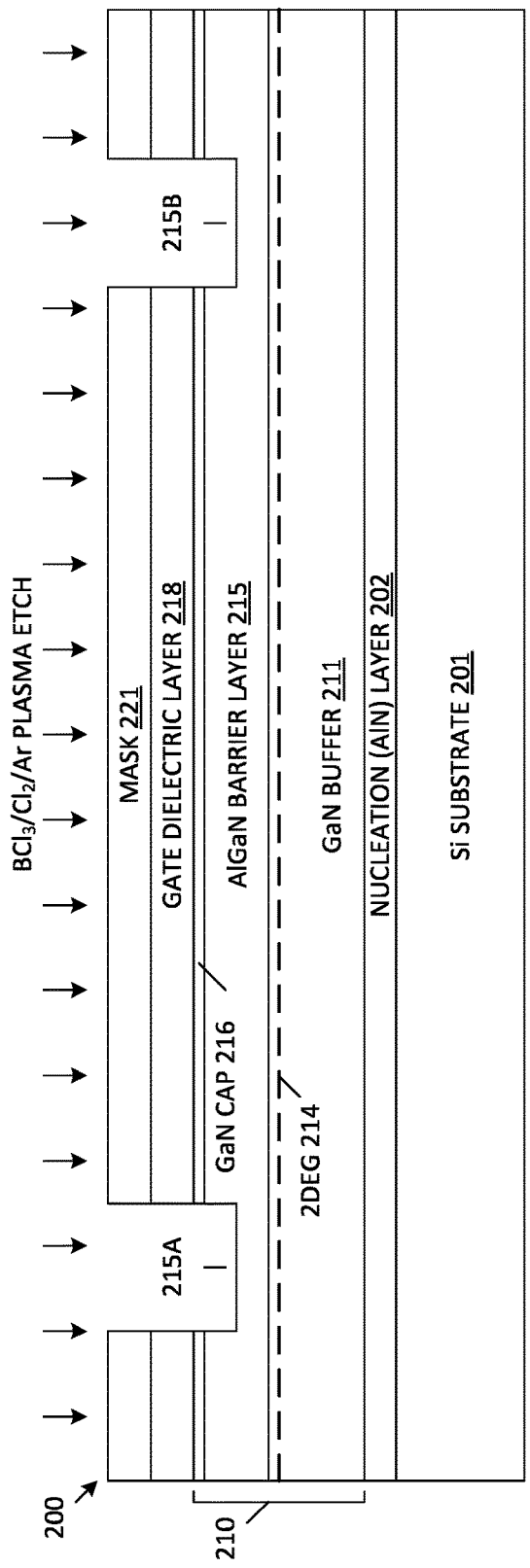

As illustrated by FIG. 2C, an etch is performed through the openings 221A-221B of mask 221 and the openings 218A-218B of the gate dielectric layer, wherein this etch removes the exposed portions of the GaN cap layer 216. A $BCl_3/Cl_2/Ar$ plasma etch is then performed through the openings 221A-221B of mask 221, the openings 218A-218B of the gate dielectric layer and the openings in the GaN cap layer 216, wherein this etch partially removes exposed portions of the AlGaN barrier layer 215, thereby forming corresponding cavities 215A-215B in the AlGaN barrier layer 215. In one embodiment, if the AlGaN barrier layer 215 has a thickness of about 20 nm, then the $BCl_3/Cl_2/Ar$ plasma etch is controlled to remove only about 10 nm of the AlGaN barrier layer 215.

Figure 2D:
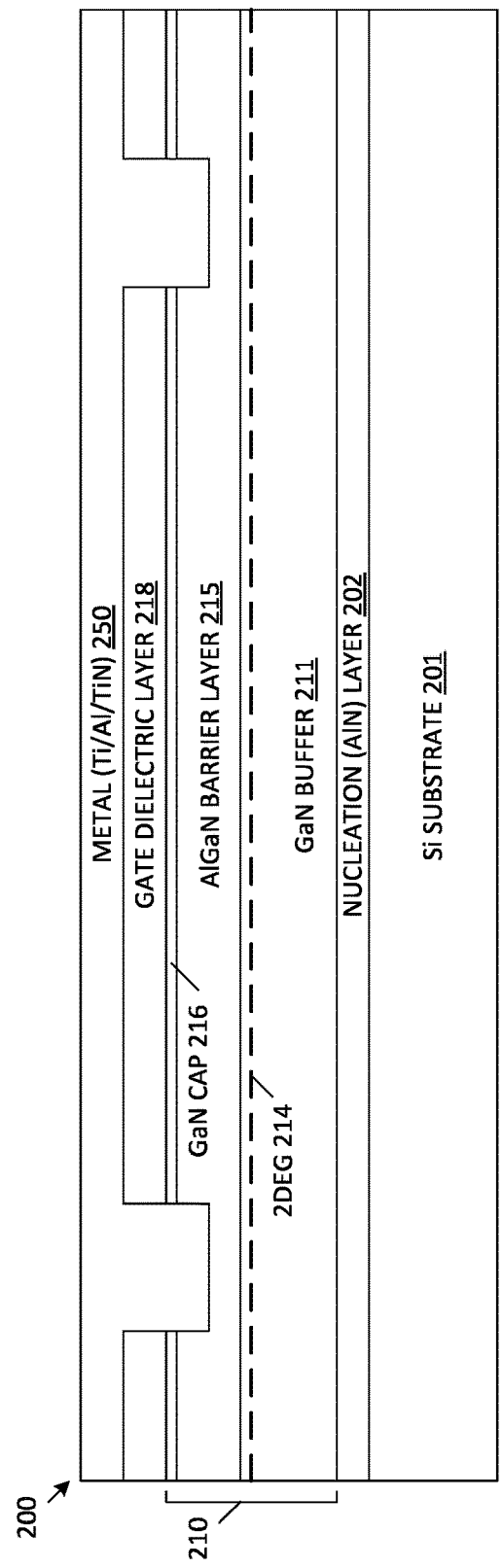

As illustrated by FIG. 2D, the mask 221 is stripped, and a metal stack 250 (or other electrically conductive structure) is subsequently formed over the resulting structure, wherein the metal stack 250 is formed in the cavities 215A-215B formed in the AlGaN barrier layer 215, and also over the remaining portions of the gate dielectric layer 218. The metal stack 250 may be formed by sputtering a thin layer of titanium (Ti) and then sputtering a layer of aluminum (Al) over the thin titanium layer. An optional titanium nitride (TiN) layer may be formed over the aluminum layer. In one embodiment, the metal stack has a thickness in the range of about 0.05 microns to 1.0 micron. As will become apparent in view of the following description, the source contact, drain contact and gate electrodes of the sensor 200 are formed from the same metal stack 250.

Figure 2E:
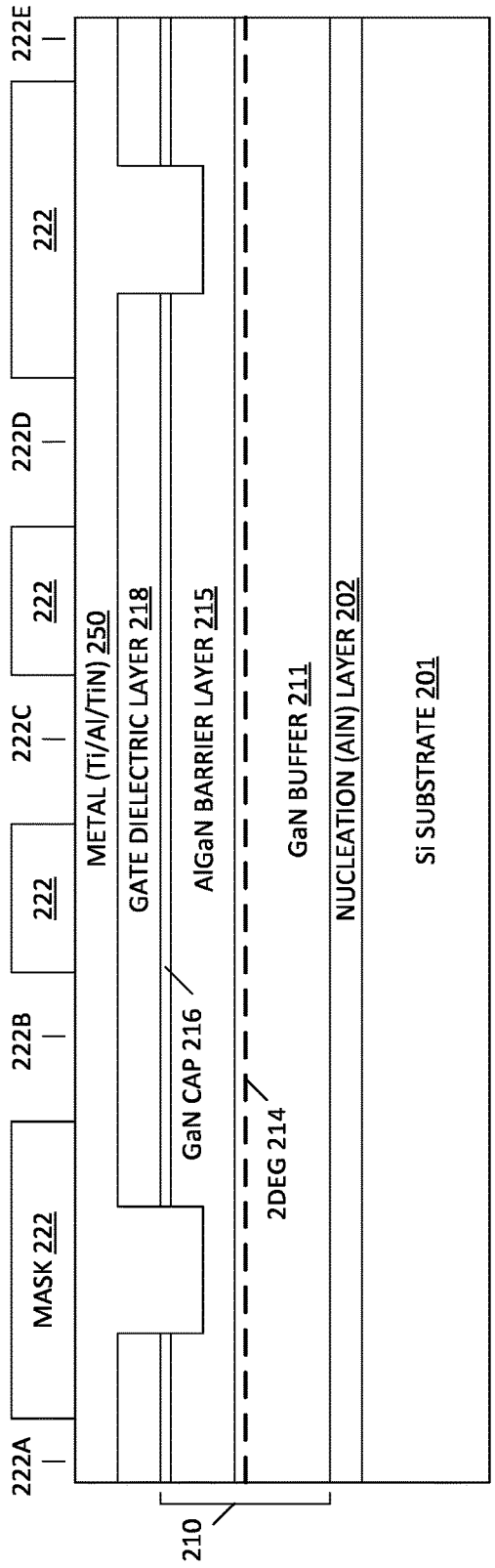

As illustrated in FIG. 2E, a second photoresist mask 222 is formed over the metal stack 250, wherein the mask 222 includes openings 222A-222E that expose portions of the metal stack 250.

Figure 2F:
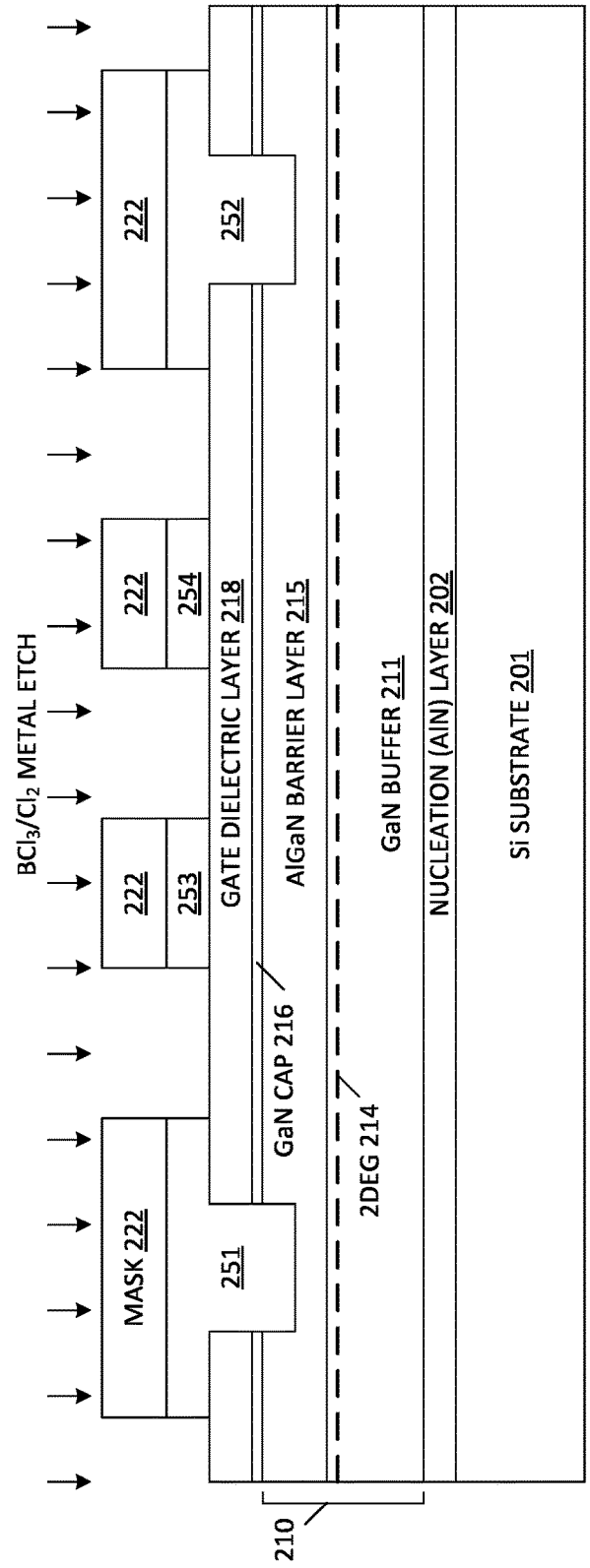

As illustrated by FIG. 2F a $BCl_3/Cl_2$ metal etch is performed through the openings 222A-222E of mask 222, wherein this etch removes the exposed portions of the metal stack 250, thereby forming metal structures 251-254. As described in more detail below, metal structures 251 and 252 form source and drain contacts of the sensor 200, and metal structures 253-254 form gate electrodes of the sensor 200.

Figure 2G:
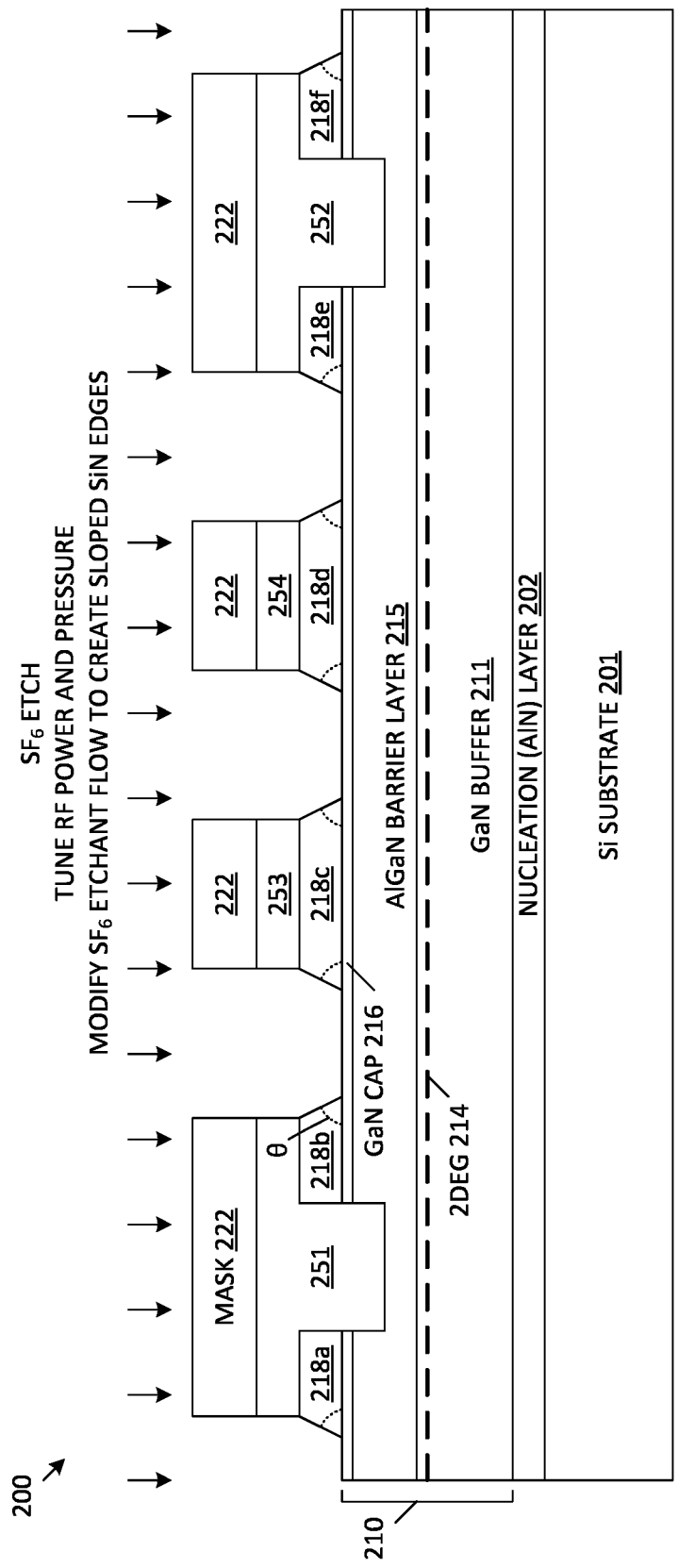

As illustrated by FIG. 2G, an $SF_6$ plasma etch is performed through mask 222 and the metal structures 251-254. The RF power and pressure of the $SF_6$ plasma etch is tuned, and the $SF_6$ etchant flow is controlled to introduce a sloped etch profile to the gate dielectric layer 218. As a result, the edges of the remaining gate dielectric regions 218a-218f are not vertical (i.e., at a 90 degree angle with respect to the upper surface of the AlGaN barrier layer 215), but rather, are sloped at an acute angle θ with respect to the upper surface of the AlGaN barrier layer. In a particular embodiment, the acute angle θ is greater than 20 degrees. In another embodiment, the angle θ is less than 70° and more than 20°. The sloped edges of gate dielectric structures 218a-218f advantageously increase the distance (and the amount of dielectric material) between the edges of metal structures 251-254 and the subsequently exposed portions of AlGaN barrier layer 215. This prevents current leakage between the metal structures 251-254 and the underlying 2DEG channel 214, advantageously contributing to the stability and reliability of the resulting sensor 200.

Note that if the edges of gate dielectric regions 218a-218f were vertical, the resulting sensor may be leaky, manifesting undesired current from the gate electrodes 253-254 to the 2DEG conductive channel 214. The mechanism of leakage may be related to damaged silicon nitride adjacent to the edges of gate electrodes 253-254, which enables leakage paths, or alternatively, by the re-sputtering of metal from the metal structures 251-254 into the exposed portions of the AlGaN barrier layer 215.

In a particular embodiment, the etch is performed at an RF power in a range of about 190-350 Watts, the pressure of the etch chamber is maintained in a range of about 250-1000 mTorr, and the $SF_6$/He ratio is 1:1 to 1:10 to obtain a slope angle θ between 20 and 70 degrees. By increasing He to $SF_6$ ratio, $Si_3N_4$ etch rate is reduced, the ratio between etch rate and polymer formation is reduced. The presence of relatively more polymers enables $Si_3N_4$ walls protection, and hence a sloped profile is obtained.

Figure 2H:
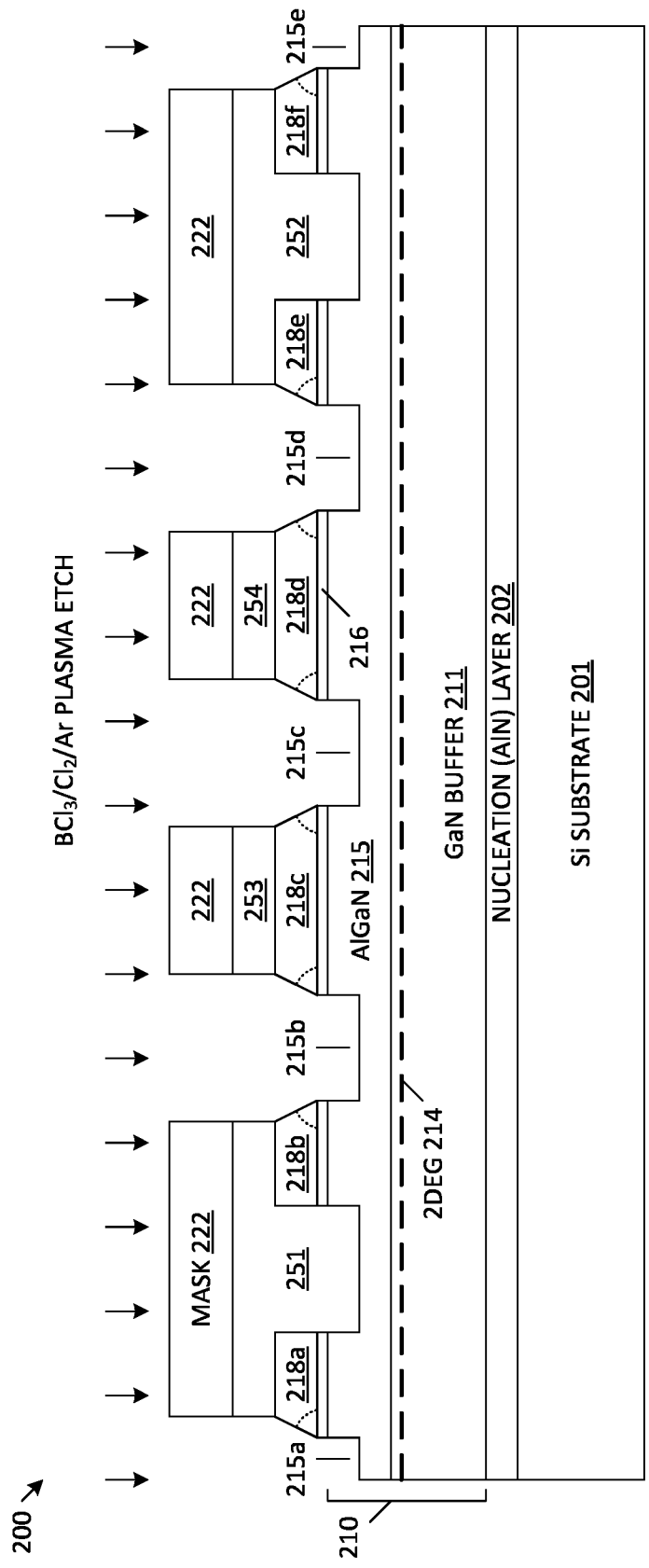

As illustrated in FIG. 2H, a $BCl_3/Cl_2/Ar$ plasma etch is performed through mask 222, metal structures 251-254 and sloped gate dielectric structures 218a-218f, wherein this etch removes the exposed portions of GaN cap layer 216 and forms cavities 215a-215e in the exposed portions of the AlGaN barrier layer 215. These cavities 215a-215e effectively thin the AlGaN barrier layer 215 in sensing regions of the sensor 200, which improves the sensitivity of the sensor 200.

Figure 2I:
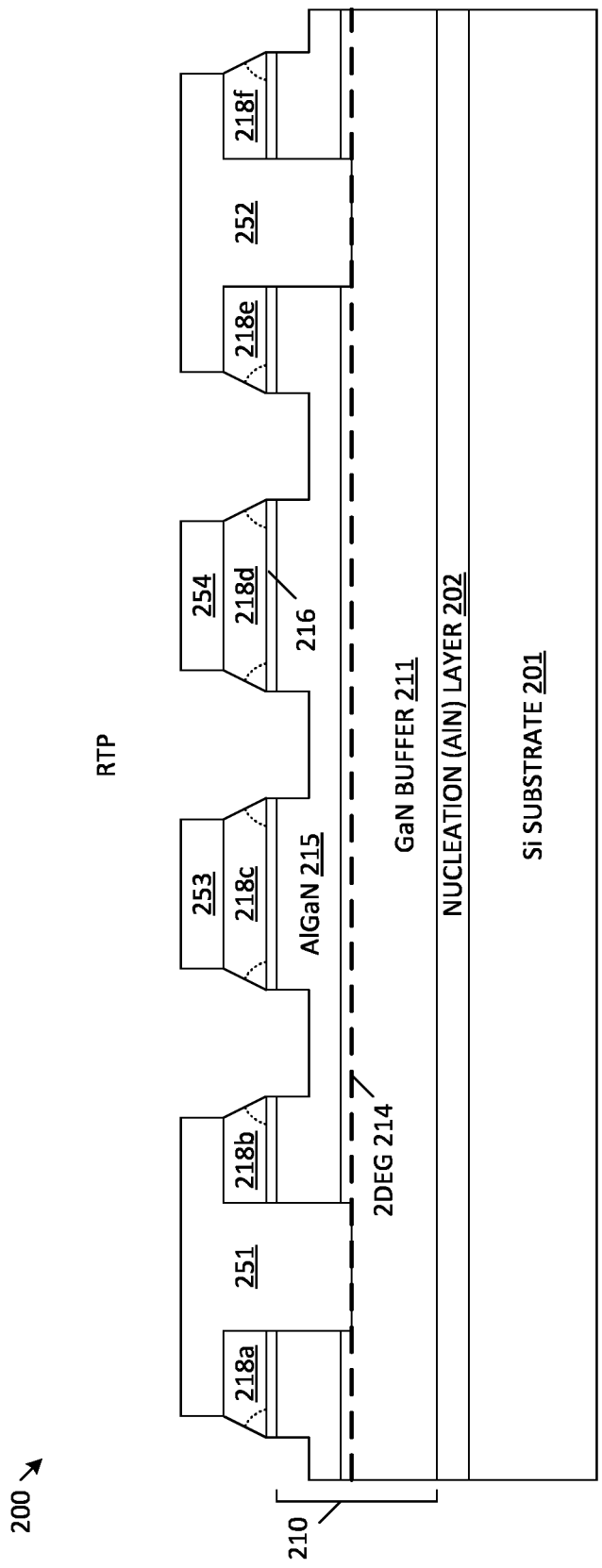

As illustrated in FIG. 2I, the mask 222 is stripped, and rapid thermal processing (RTP) is performed, wherein an intermetallic reaction occurs between the Ti, Al, and N extracted from GaN buffer 211, thereby creating source and drain (ohmic) contacts 251 and 252 that are in electrical contact with the underlying 2DEG channel 214. In one embodiment, the RTP process is performed at temperatures in the range of about 500-900° C., for a duration of about 10 to 100 seconds.

Figure 2J:
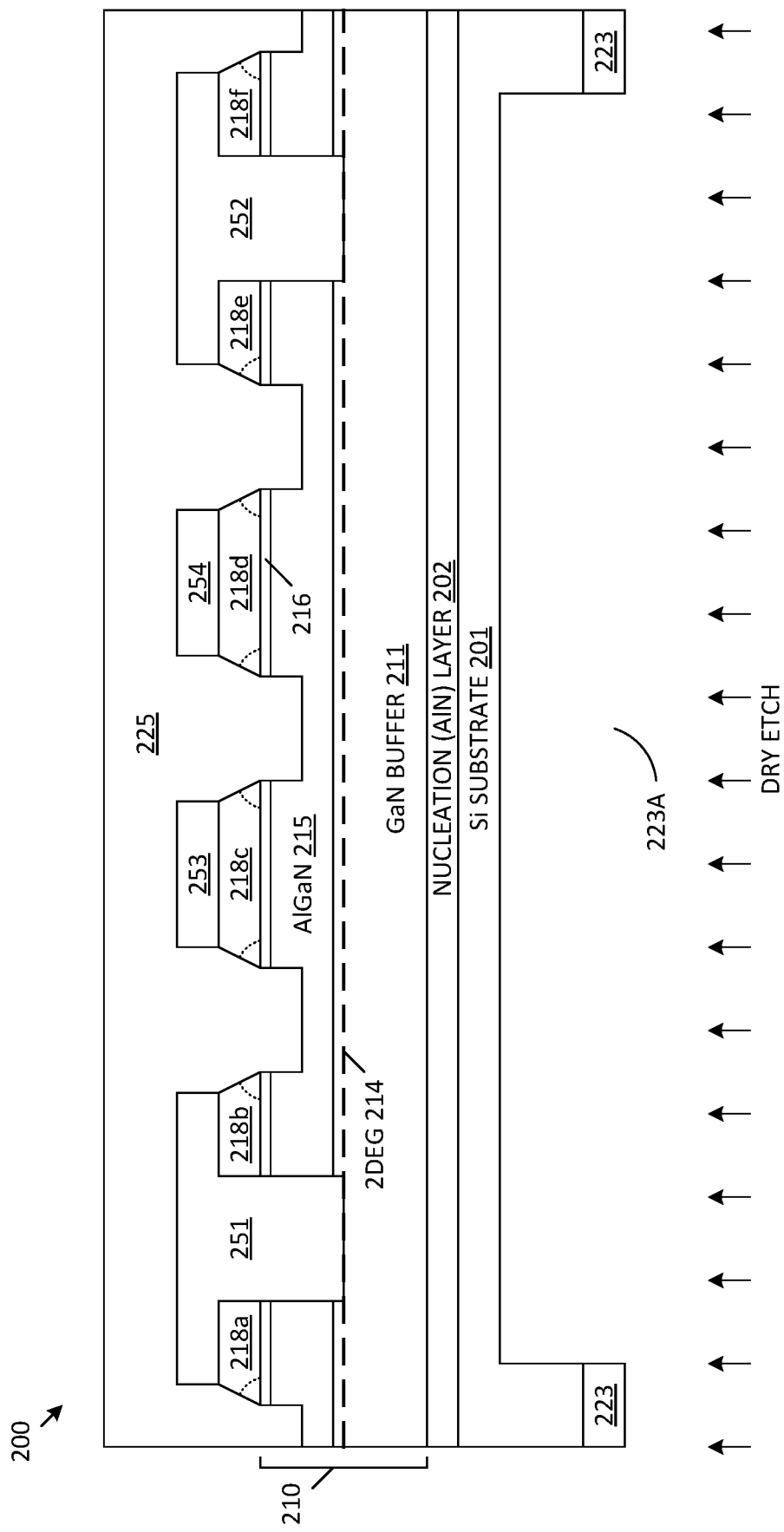

As illustrated in FIG. 2J, a temporary protective film 225 is formed on the front side of the sensor 200. In one embodiment, protective film 225 is a plastic tape placed on the front side. In addition, a mask 223 is formed over the backside surface of substrate 201, wherein an opening 223A in the mask 223 defines the location of a membrane region of the sensor 200. A dry etch is performed through mask 223, wherein the dry etch extends only partially through the exposed portions of silicon substrate 201. In one embodiment, the dry etch is stopped when the remaining thickness of silicon substrate 201 is between 5 to 100 microns. In a particular embodiment, the dry etch is a reactive ion etch (RIE) that implements a Bosch process that includes a fluorine species for etching and a fluorocarbon species for polymerization.

Figure 2K:
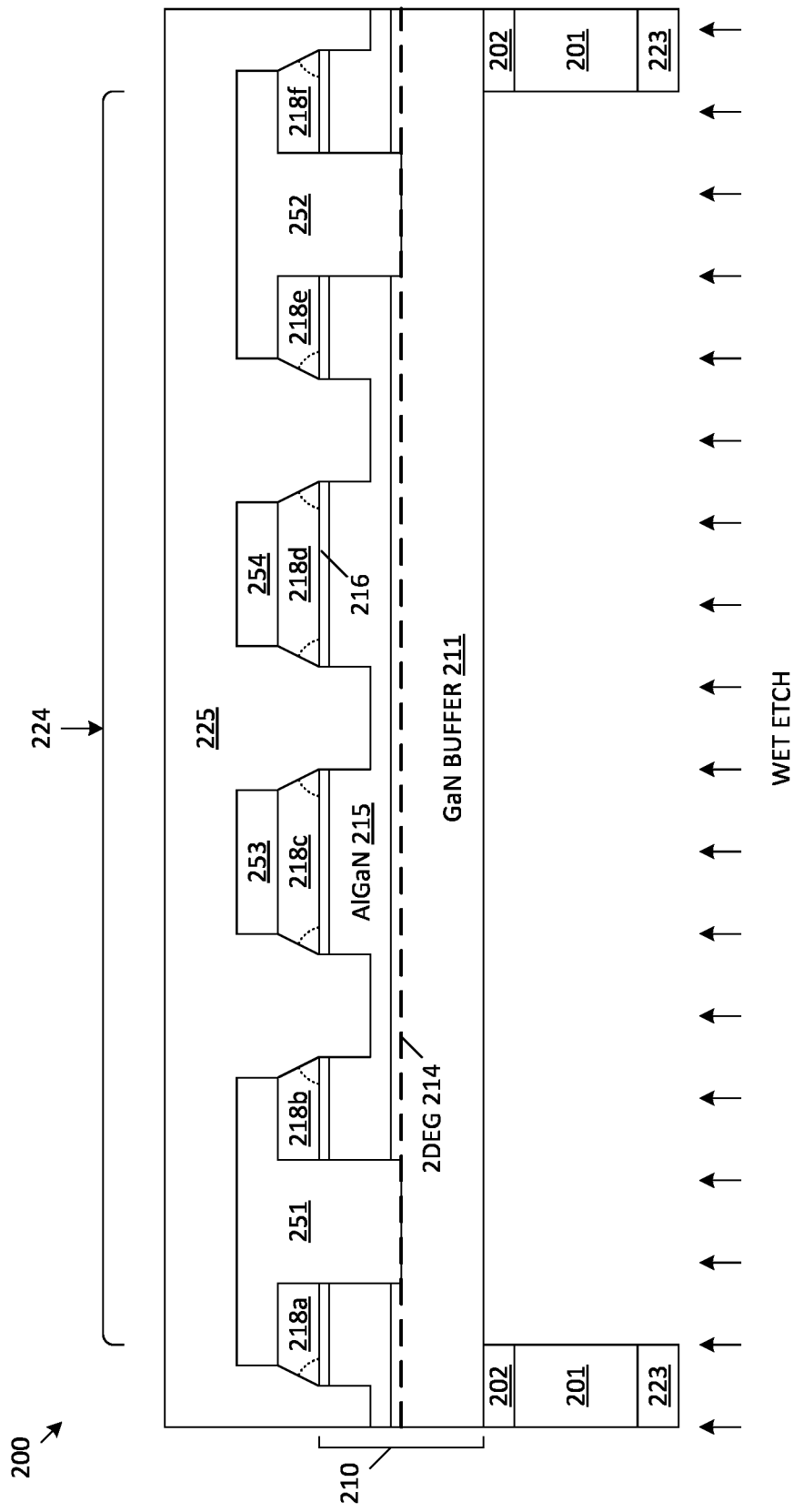

As illustrated in FIG. 2K, a wet etch is then performed through mask 223, wherein the wet etch extends entirely through the remaining thickness of silicon substrate 201 and exposes the nucleation layer 202 (i.e., the wet etch selectively stops on the AlN nucleation layer 202). In one embodiment, the silicon wet etch process is performed using a mixture of hydrofluoric and nitric acids with various diluents and a variety of process temperatures to enable control of the etch profile. The process may be performed in either a bath or spray tool. In various embodiments, the nucleation (AlN) layer 202 is also removed by wet etch through mask 223 using a tetramethylammonium hydroxide (TMAH) solution. During the back side wet etch processes, the front side of the sensor 200 is protected by the temporary protective film 225, thereby preventing the etching of the metal structures 251-254. The wet etch processes advantageously avoid plasma damage to structures fabricated at the wafer front side, including the gate dielectric structures 218a-218f of sensor 200. Note that damage to the gate dielectric structures 218a-218f can undesirably result in gate dielectric breakdown. Mask 223 and temporary protective film 225 are removed after the wet etch processes are complete.

The wet etch defines a thin membrane region 224 having a low thermal mass, due to the fact that the substrate 201 and nucleation layer 202 are removed from this membrane region 224. The thin membrane region 224 can be utilized to facilitate and improve various sensor operations. For example, the membrane region 224 facilitates: fast response to temperature due to low thermal mass of the membrane in a temperature sensor, pressure sensing in a pressure sensor, surface regeneration (by heating) in a gas sensor, and suppression of persistent photoconductivity effects (by heating) in an ultra-violet (UV) radiation sensor.

In accordance with one variation of the embodiment of FIGS. 2A-2K, the GaN heterostructure 210 is modified to include an etch stop layer and a second AlGaN barrier layer between the AlGaN barrier layer 215 and the gate dielectric layer 218. This embodiment is described in more detail below in connection with FIGS. 3A-3L.

Figure 3A:
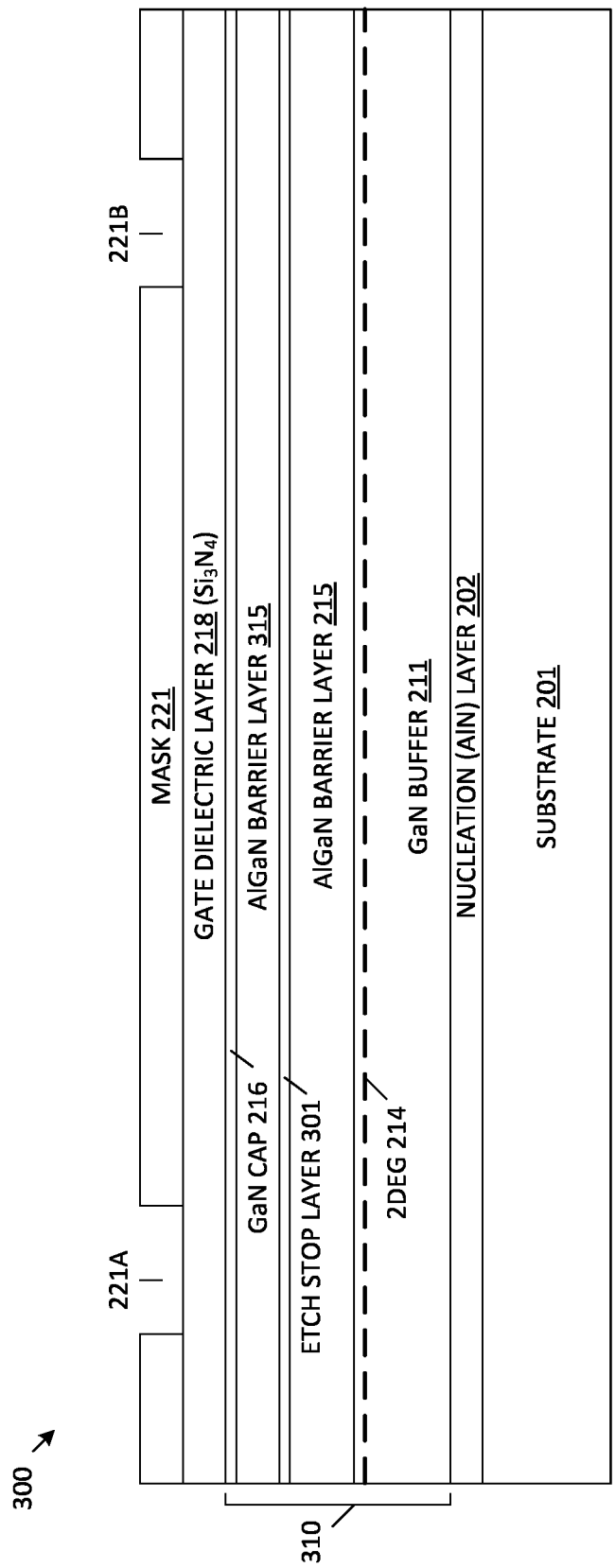
FIGS. 3A, 3B, 3C, 3D, 3E, 3F, 3G, 3H, 3I, 3J, 3K and 3L are cross sectional views of a GaN sensor, which includes a gate dielectric having a sloped profile and an etch stop layer, during various processing steps in accordance with an alternate embodiment of the present invention.

FIGS. 3A-3L are cross sectional views of a sensor 300 during various processing steps in accordance with an alternate embodiment of the present invention. Because sensor 300 is similar to sensor 200, similar elements in FIGS. 2A-2K and 3A-3L are labeled with similar reference numbers. Thus, as illustrated by FIG. 3A, sensor 300 (during an initial processing step) includes substrate 201, nucleation layer 202, GaN buffer 211, 2DEG channel 214, AlGaN barrier layer 215, GaN cap layer 216, gate dielectric layer 218 and mask 221, which are described in detail above in connection with FIG. 2A. In addition, sensor 300 includes an etch stop layer 301 formed on the AlGaN barrier layer 215, and an AlGaN layer 315 formed on the etch stop layer 310, thereby forming a GaN heterostructure 310 that includes GaN buffer 211, AlGaN barrier layer 215, etch stop layer 301, AlGaN barrier layer 315 and GaN cap layer 216. In one embodiment, the first AlGaN barrier layer 215 and the second AlGaN layer 315 each have a thickness in a range of about 5 to 50 nanometers, and a composition of $Al_xGa_yN$, wherein x is greater than zero, and y is less than one. In one embodiment, the etch stop layer 301 has a thickness in a range of about 0.5 to 5 nanometers, and a composition of $Al_xGa_yN$, wherein x is greater than 0.5 and less than or equal to 1, and y is greater than or equal to zero and less than 0.5. In each embodiment, the composition of etch stop layer 301 is sufficiently different than the compositions of AlGaN barrier layer 215 and AlGaN layer 315, such that etch stop layer 301 may be etched at a significantly different rate than AlGaN barrier layer 215 and AlGaN layer 315. As will become apparent in view of the following description, the thickness of the AlGaN barrier layer 215 is selected to have the desired thickness of exposed AlGaN regions in the final structure of sensor 300.

Figure 3B:
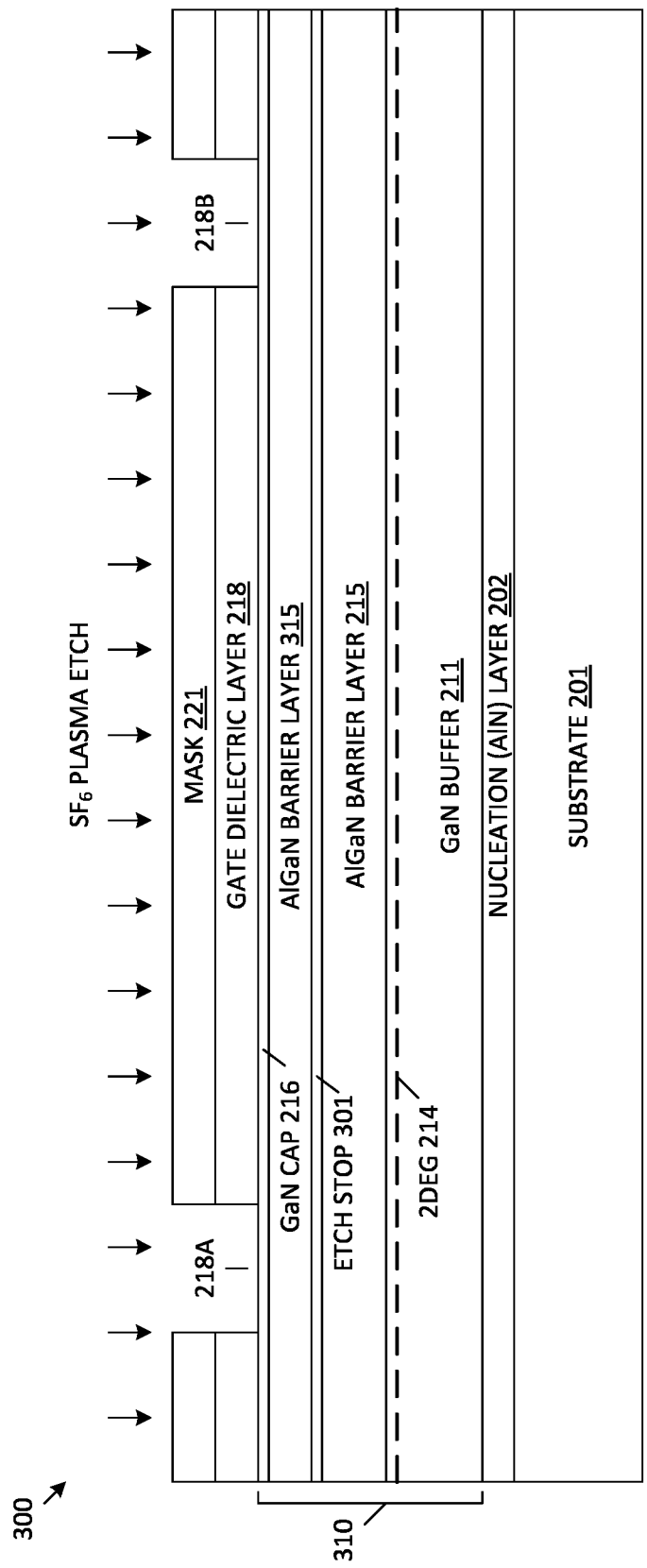

As illustrated by FIG. 3B, an $SF_6$ plasma etch is performed through the openings 221A-221B of mask 221, wherein this etch removes exposed portions of the silicon nitride gate dielectric layer 218, thereby forming corresponding openings 218A-218B through gate dielectric layer 218. This etch exposes portions of the upper surface of AlGaN layer 315.

Figure 3C:
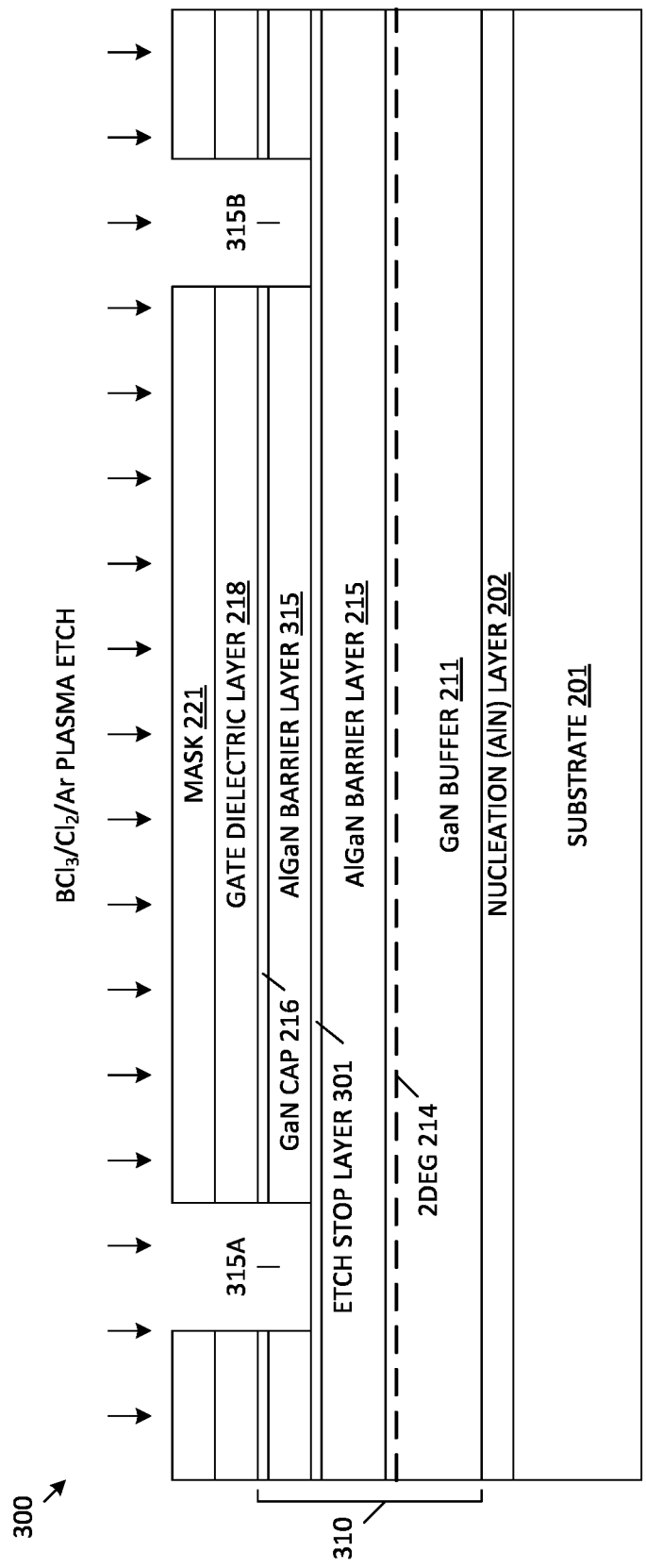

As illustrated by FIG. 3C, a first $BCL_3/Cl_2/Ar$ etch is performed through mask 221 and openings 218A-218B, wherein this etch removes the exposed portions of GaN cap layer 216 and the exposed portions of the AlGaN layer 315, thereby forming corresponding openings 315A-315B through the AlGaN layer 315. The recipe of the $BCl_3/Cl_2/Ar$ plasma etch, and the compositions of the AlGaN layer 315 and the underlying etch stop layer 301 are selected such that the etch removes AlGaN layer 315 at a much higher rate than the etch stop layer 301. In one embodiment, the first $BCl_3/Cl_2/Ar$ plasma etch is performed in a Transferred Coupled Plasma (TCP) etcher, with pressure in the range of 5-50 mTorr, RF power in the range 100-1000 Watts, and $Cl_2/BCl_3$ ratio of 1:1 to 1:10 with Ar dilution.

Figure 3D:
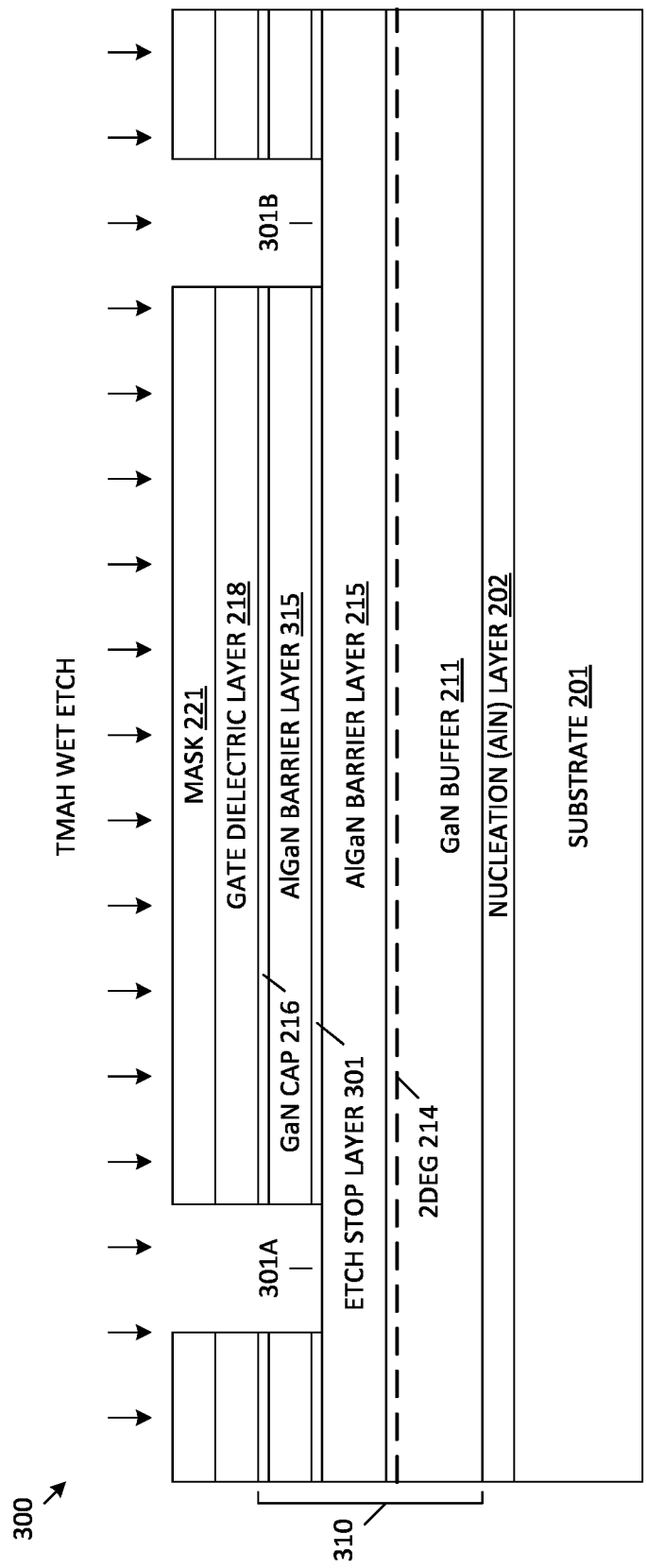

As illustrated by FIG. 3D, a wet etch process with chemistry such as TMAH is performed through the openings 221A-221B of mask 221, the openings 218A-218B of the gate dielectric layer 218 and the openings 315A-315B of AlGaN layer 315, wherein this etch removes the exposed portions of the etch stop layer 301, thereby forming corresponding openings 301A-301B through the etch stop layer 301. The chemistry of wet etch solution, and the compositions of the etch stop layer 301 and the underlying AlGaN barrier layer 215 are selected such that the wet etch removes etch stop layer 301 at a much higher rate than the AlGaN barrier layer 215. This enables to wet etch of the etch stop layer 301 to be reliably stopped upon reaching the AlGaN barrier layer 215. In one embodiment, the wet etch is performed by 25 wt % TMAH solution at room temperature.

Figure 3E:
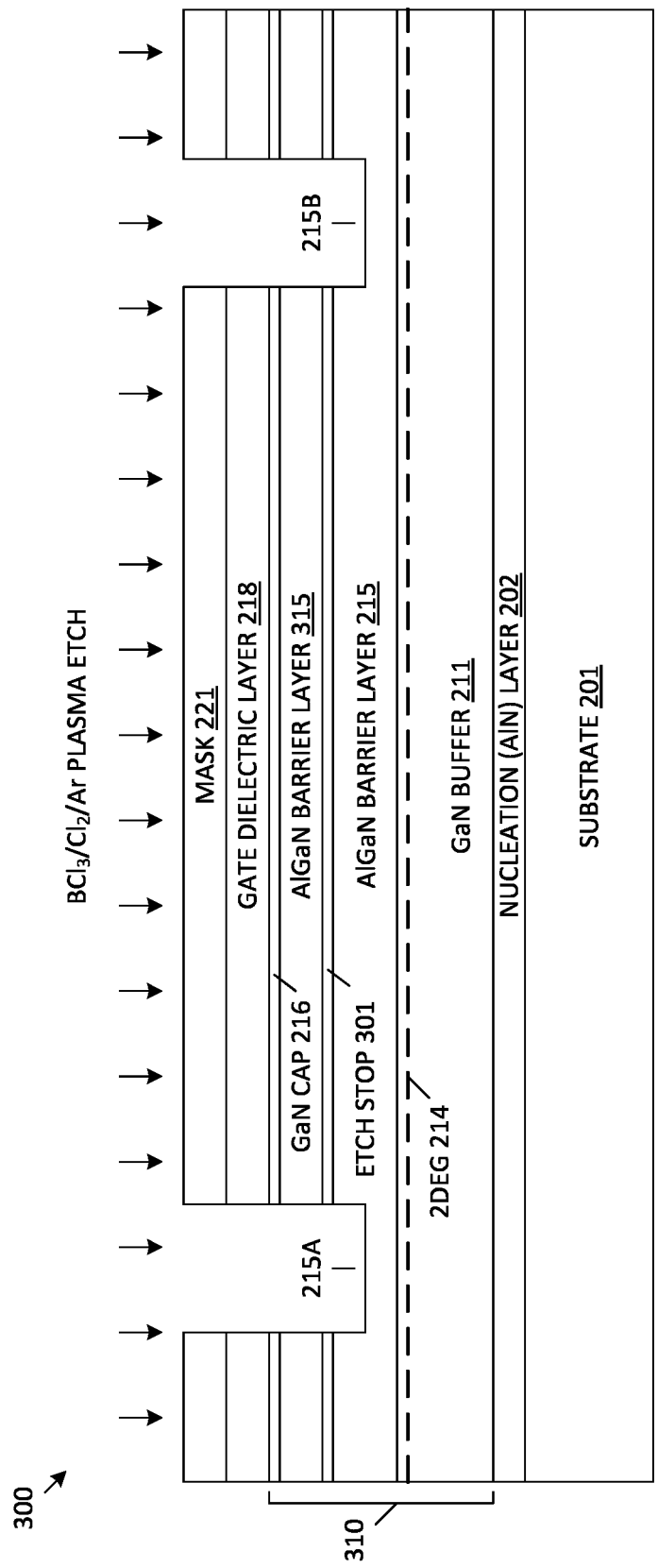

As illustrated by FIG. 3E, a $BCl_3/Cl_2/Ar$ plasma etch is performed through the openings 221A-221B of mask 221, the openings 218A-218B of the gate dielectric layer 218, and the openings 315A-315B of AlGaN layer 315 and the openings 301A-301B of etch stop layer 301, wherein this etch partially removes the exposed portions of the AlGaN barrier layer 215, thereby forming corresponding cavities 215A-215B in the AlGaN barrier layer 215. In one embodiment, if the AlGaN barrier layer 215 has a thickness of about 20 nm, then the $BCl_3/Cl_2/Ar$ plasma etch is controlled to remove only about 10 nm of the AlGaN barrier layer 215.

Figure 3F:
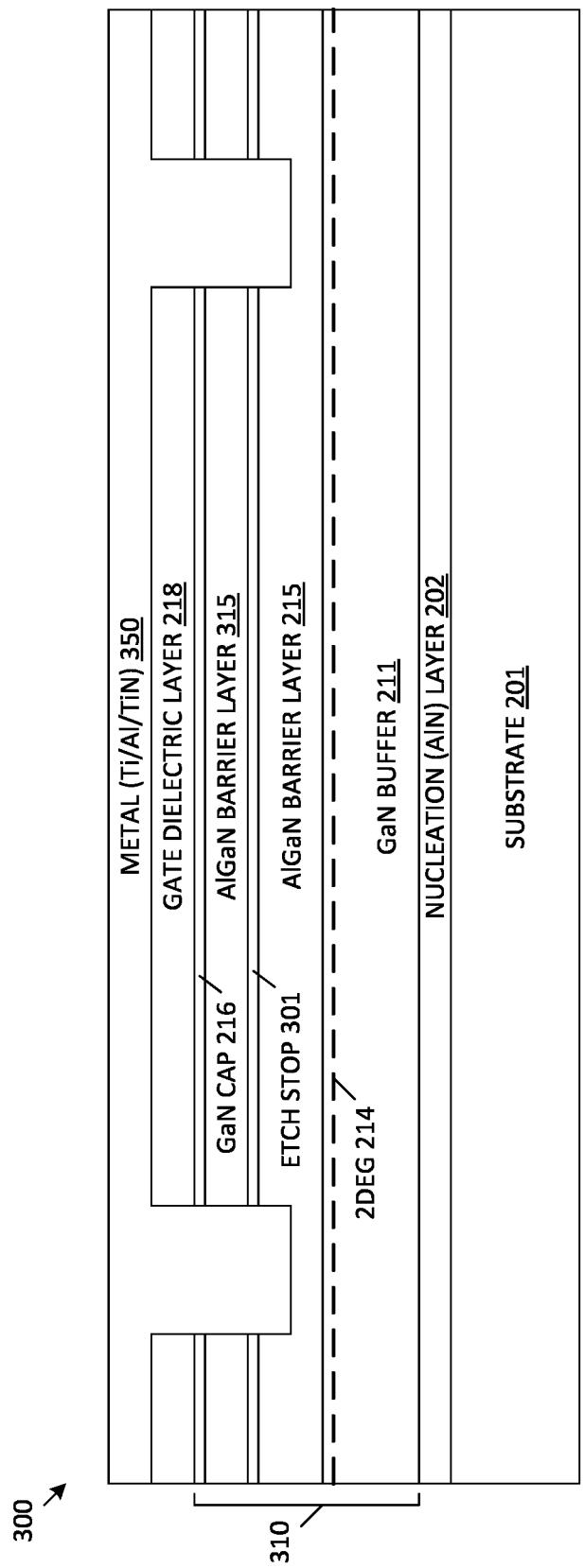

As illustrated by FIG. 3F, the mask 221 is stripped, and a metal stack 350 (or other electrically conductive structure) is subsequently formed over the resulting structure, wherein the metal stack 350 is formed in the same manner described above for metal stack 250 (FIG. 2D).

Figure 3G:
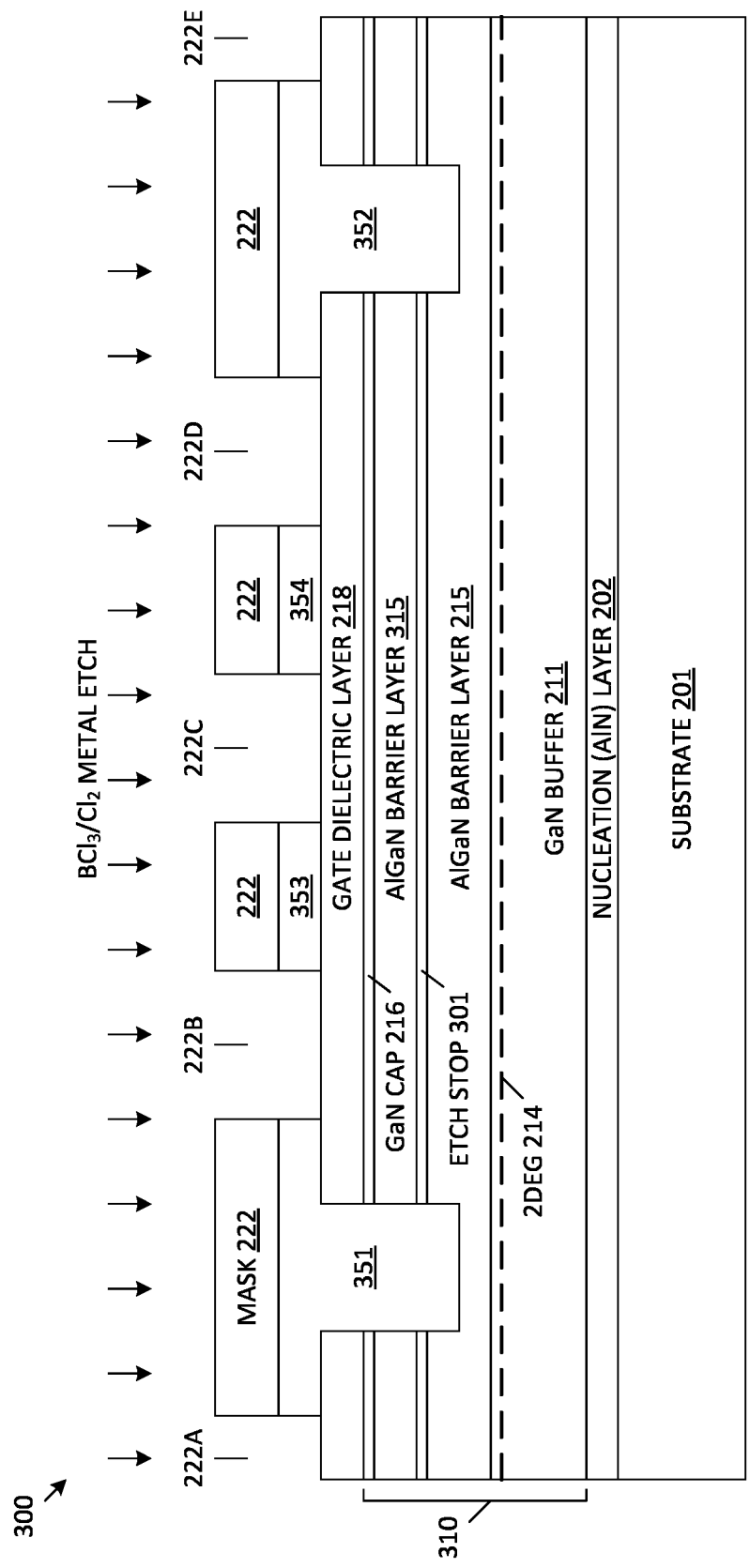

As illustrated in FIG. 3G, mask 222 is formed over the metal stack 350, and a $BCl_3/Cl_2$ metal etch is performed through the openings 222A-222E of mask 222, wherein this etch removes the exposed portions of the metal stack 350, thereby forming metal structures 351-354. As described in more detail below, metal structures 351 and 352 form source and drain contacts of the sensor 300, and metal structures 353-354 form gate electrodes of the sensor 300.

Figure 3H:
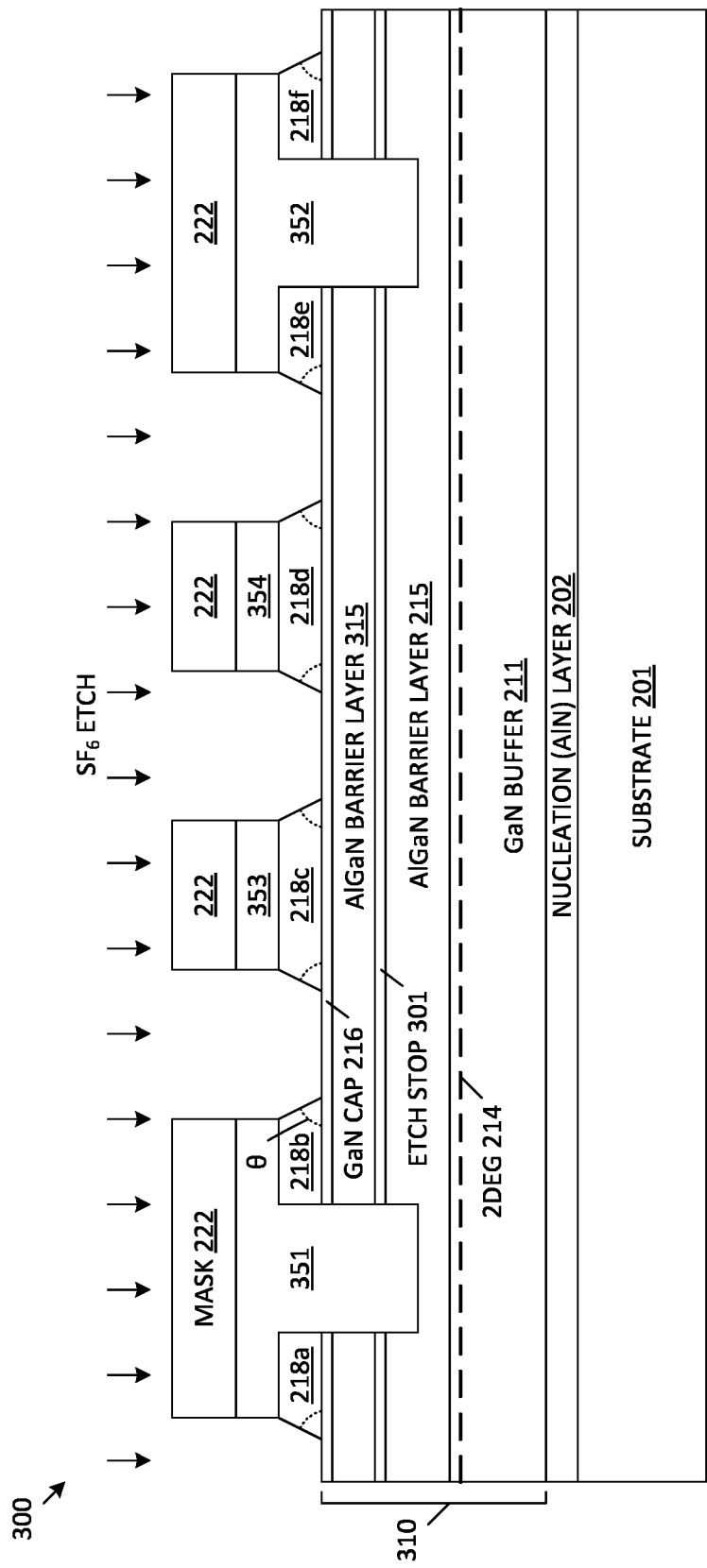

As illustrated by FIG. 3H, an $SF_6$ plasma etch is performed through mask 222 and the metal structures 351-354. The RF power and pressure of the $SF_6$ plasma etch is tuned, and the $SF_6$ etchant flow is controlled to introduce a sloped etch profile to the gate dielectric layer 218 in the manner described above in connection with FIG. 2G, thereby forming gate dielectric structures 218a-218f. Again, the gate dielectric structures 218a-218f exhibit sloped edge profiles having acute angles θ. As described above, in a particular embodiment, the acute angle θ is greater than 20 degrees. In another embodiment, the angle θ is less than 70° and more than 20°.

Figure 3I:
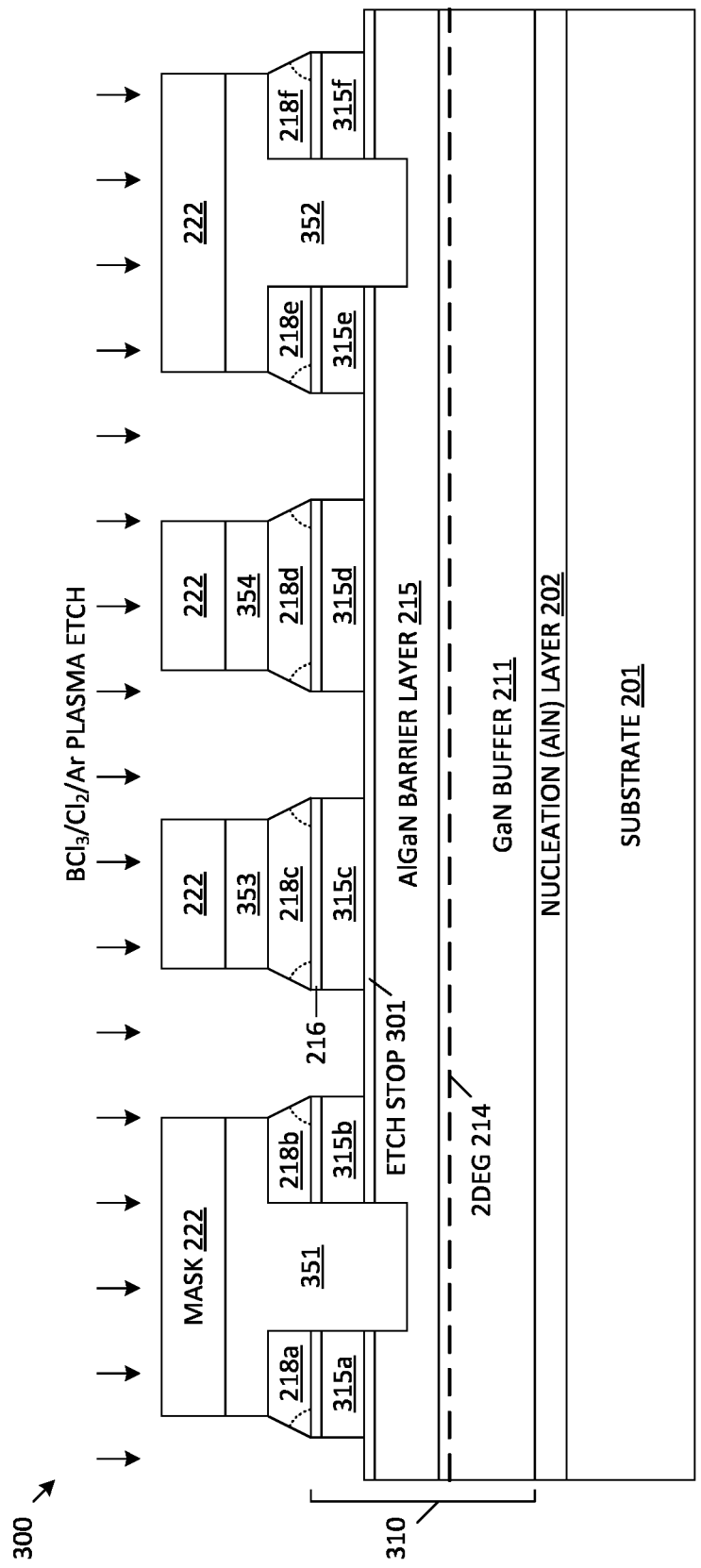

As illustrated in FIG. 3I, an inductively coupled plasma reactive ion etch (ICP-RIE) $BCL_3/Cl_2/Ar$ based etch is performed through mask 222, metal structures 351-354 and sloped gate dielectric structures 218a-218f, wherein this etch removes the exposed portions of GaN cap layer 216 and extends through AlGaN layer 315 and stops on etch stop layer 301, leaving AlGaN structures 315a-315f. In one embodiment, the recipe of the $BCl_3/Cl_2/Ar$ etch is identical to the recipe for the first $BCl_3/Cl_2/Ar$ etch, which is described above in connection with FIG. 3C. As a result, this $BCl_3/Cl_2/Ar$ etch of the AlGaN layer 315 is reliably stopped upon reaching the etch stop layer 301. Under these conditions, the initial thickness of the AlGaN barrier layer 215 corresponds with the final thickness of the AlGaN barrier layer 215 between the metal structures 351-354. That is, the final thickness of the AlGaN barrier layer 215 is effectively selected by controlling the initial thickness of the AlGaN barrier layer 215 during fabrication of this layer. Advantageously, an etch is not required to select the final thickness of the AlGaN barrier layer 215 between the metal structures 351-354, thereby making it relatively easy to control the final thickness of the AlGaN barrier layer 215 between the metal structures 351-354.

Figure 3J:
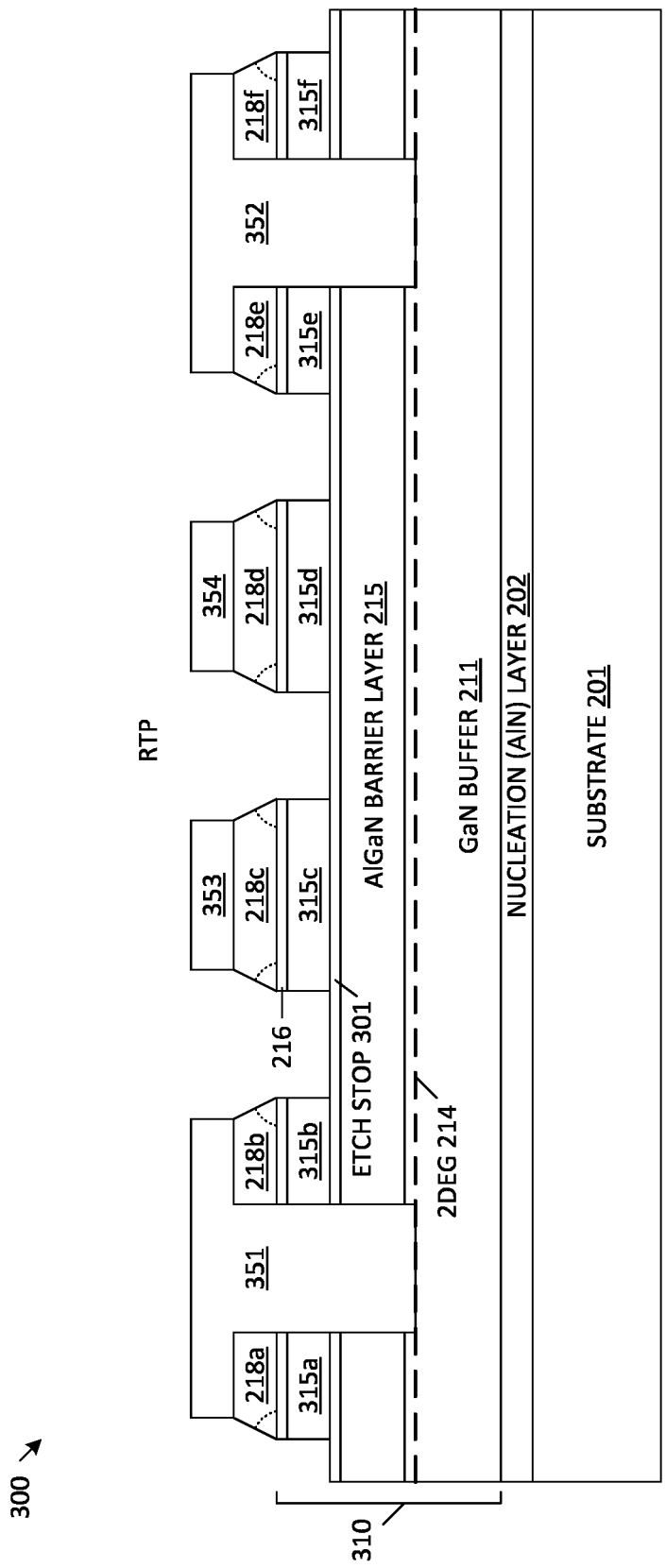

As illustrated by FIG. 3J, the mask 222 is stripped, and rapid thermal processing (RTP) is performed, wherein an intermetallic reaction occurs between the Ti, Al, and N extracted from GaN buffer 211 thereby creating source and drain (ohmic) contacts 351 and 352 that are in electrical contact with the underlying 2DEG channel 214. In one embodiment, the RTP process implements temperatures in the range of about 500-900° C., for a duration of about 10-100 sec.

Figure 3K:
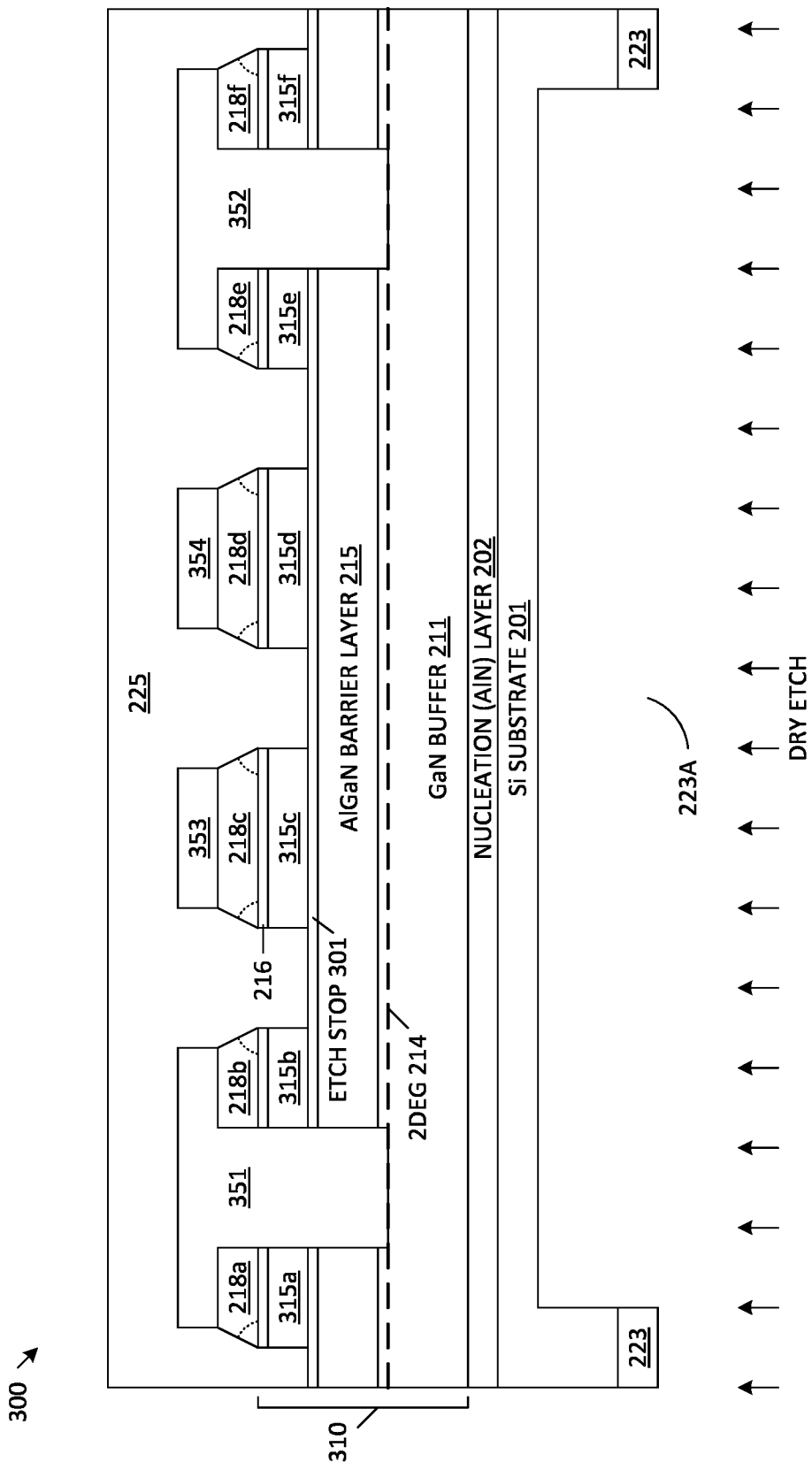

As illustrated by FIG. 3K, temporary protective film 225 is formed over the front side of the sensor 300, and mask 223 is formed over the backside surface of substrate 201. A dry etch, which extends only partially through substrate 201 is performed through mask 223, in the manner described above in connection with FIG. 2J.

Figure 3L:
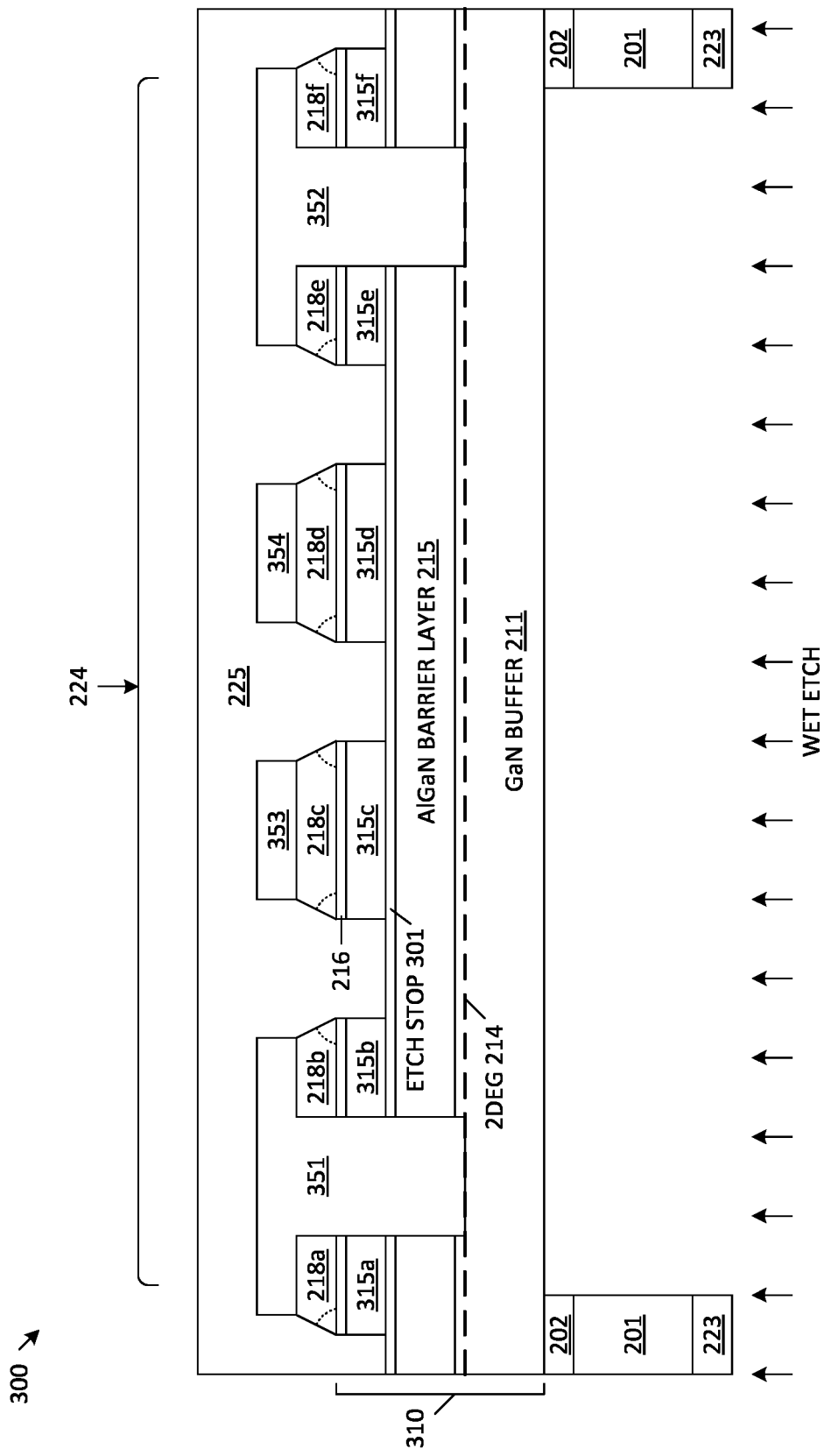

As illustrated by FIG. 3L, a wet etch, which extends entirely through substrate 201 is then performed through mask 223, in the manner described above in connection with FIG. 2K. In various embodiments, the nucleation (AlN) layer 202 is also removed by wet etch in a tetramethylammonium hydroxide (TMAH) solution, in the manner described above in connection with FIG. 2K. As described above, temporary protective film 225 prevents the etching of the metal structures 351-354 during the back side wet etch processes. The wet etches define the thin membrane region 224 of sensor 300. Mask 223 and temporary protective film 225 are subsequently removed As described above, the processes of FIGS. 2A-2K and 3A-3L provide sensors 200 and 300 having gate dielectric structures 218a-218f having sloped profiles, advantageously increasing the dielectric material located between the edges of metal structures 251-254 and 351-354 and the exposed regions of AlGaN barrier layer 215. In accordance with alternate embodiments, described below, the sloped-profile gate dielectric structures 218a-218f can be effectively replaced or augmented with dielectric sidewall spacers.

FIGS. 4A-4D are cross sectional views of a sensor 400 during various processing steps in accordance with an alternate embodiment of the present invention. Because sensor 400 is similar to sensor 200, similar elements in FIGS. 2A-2K and 4A-4D are labeled with similar reference numbers.

Figure 4A:
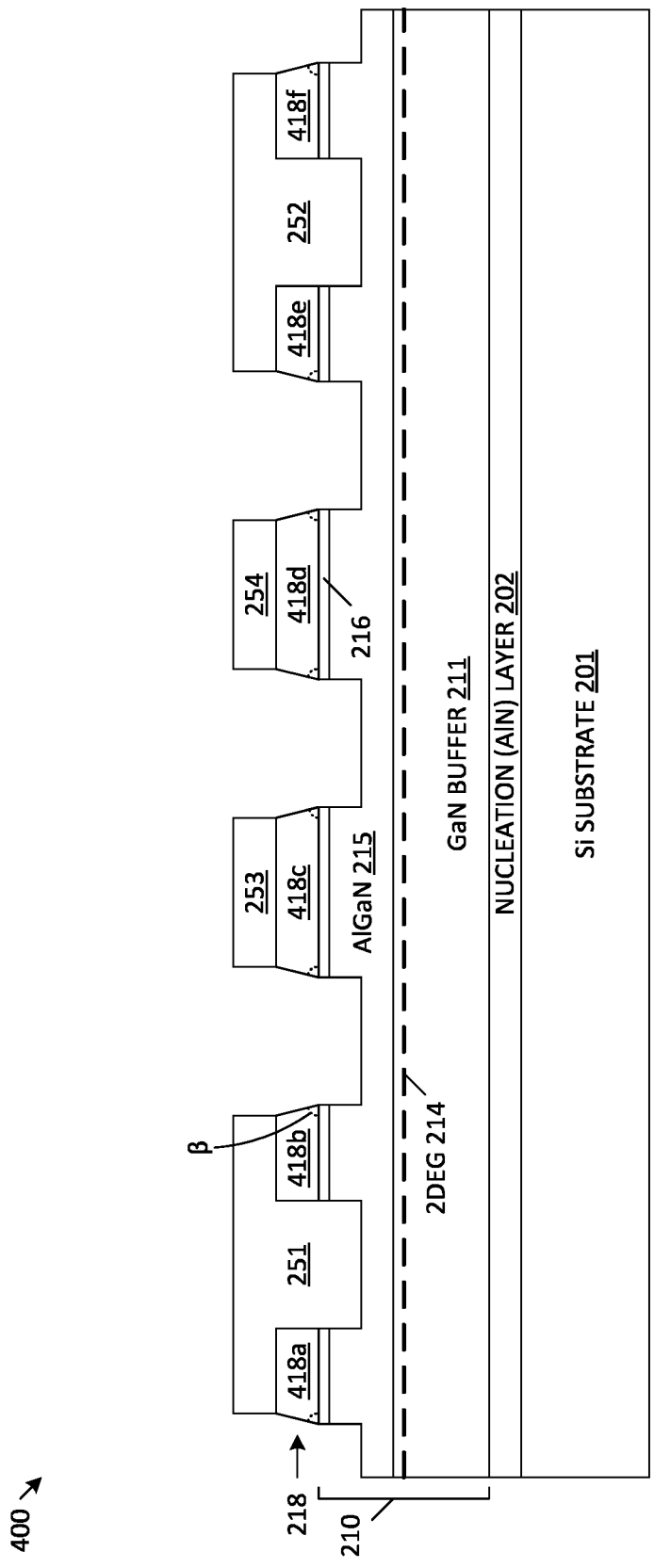
FIGS. 4A, 4B, 4C and 4D are cross sectional views of a GaN sensor, which includes dielectric sidewall spacers, during various processing steps in accordance with an alternate embodiment of the present invention.

As illustrated by FIG. 4A, sensor 400 (during an initial processing step) includes substrate 201, nucleation layer 202, GaN buffer 211, 2DEG channel 214, AlGaN barrier layer 215, GaN cap layer 216, gate dielectric layer 218, and metal structures 251-254, which are described in detail above in connection with FIGS. 2A-2H. Note that the mask 222 of FIG. 2H is stripped in FIG. 4A. As illustrated by FIG. 4A, the $SF_6$ plasma etch performed through gate dielectric layer 218 (see, e.g., FIG. 2G) is controlled to create gate dielectric regions 418a-418f. The RF power and pressure of the $SF_6$ plasma etch is tuned, and the $SF_6$ etchant flow is controlled such that the edges of gate dielectric regions 418a-418f are sloped at an angle (β) with respect to the upper surface of the AlGaN barrier layer 215. In a particular embodiment, this angle (β) is about 90 degrees. In an alternate embodiment, this angle (β) is an acute angle greater than 70 degrees. The sloped edges of the gate dielectric regions 418a-418f improve the sidewall coverage of the subsequently formed dielectric spacers 401-408, and also increase the distance (and the amount of dielectric material present) between the edges of the remaining metal structures 251-254 and the exposed regions of the AlGaN barrier layer 215. This advantageously reduces current leakage from the metal structures 251-254 to the underlying 2DEG channel 214, thereby maintaining stability and reliability of the resulting transistor structure.

Figure 4B:
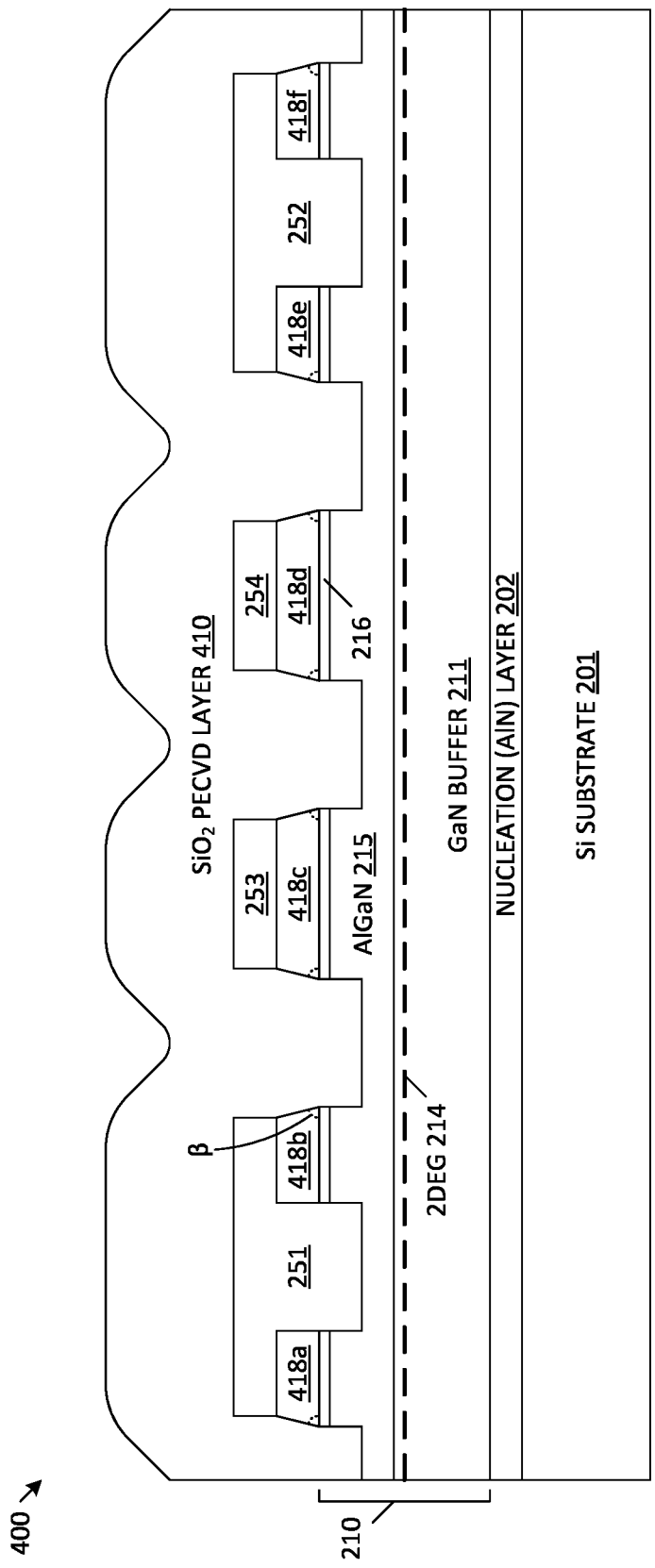

As illustrated in FIG. 4B, a dielectric layer 410 is formed over the upper surface of the resulting structure. In one embodiment, dielectric layer 410 is a silicon oxide ($SiO_2$) layer deposited using a plasma enhanced chemical vapor deposition (PECVD) process. In one embodiment, dielectric layer 410 has a thickness in the range of about 0.05 to 0.5 microns.

Figure 4C:
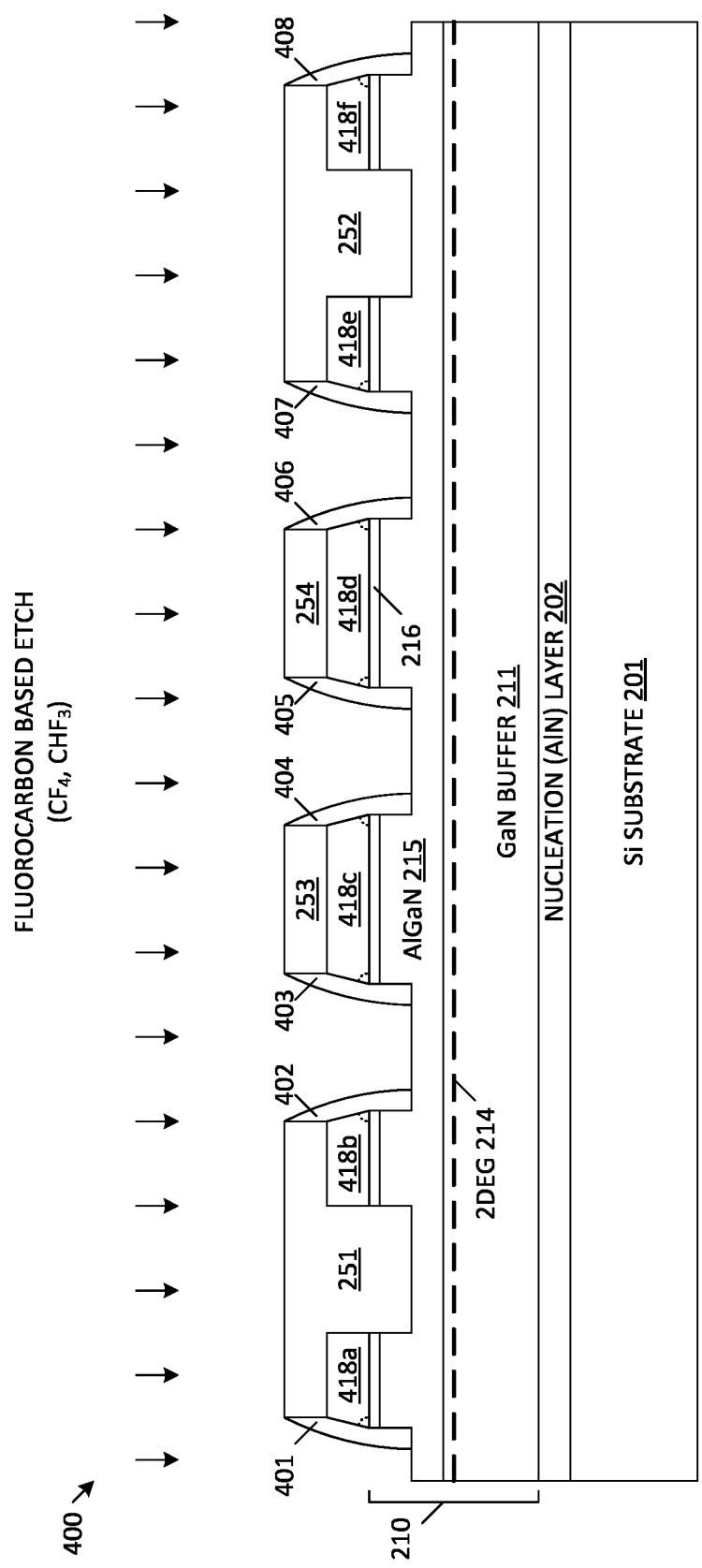

As illustrated in FIG. 4C, an anisotropic etch is performed without a mask, using a fluorocarbon-based chemistry such as $CF_4$ and $CHF_3$, thereby forming dielectric sidewall spacers 401-408 on the sidewalls of metal structures 251-254. The dielectric sidewall spacers 401-408 advantageously isolate the edges of metal structures 251-254 from the exposed portions of AlGaN barrier layer 215, thereby preventing leakage currents from the gate electrodes 253-254 to the 2DEG conductive channel 214 during normal operation of the sensor 400.

Figure 4D:
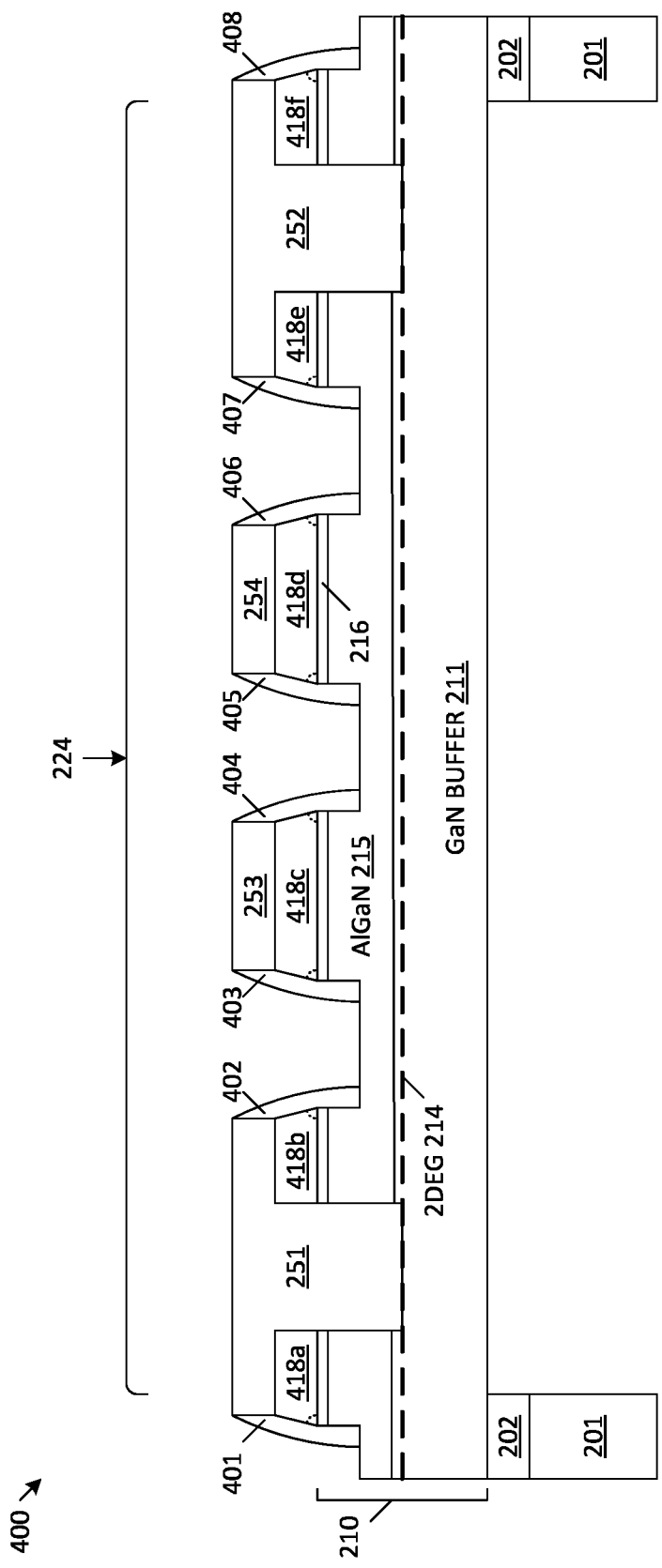

As illustrated in FIG. 4D, the rapid thermal processing (RTP) of FIG. 2I is performed (whereby the metal structures 251-252 are extended into electrical contact with the underlying 2DEG region 214 in the manner described above), and the dry etch of FIG. 2J and the wet etches of FIG. 2K are performed (thereby forming the thin membrane region 224 in the manner described above.) Mask 223 and temporary protective film 225 are then removed, resulting in the sensor 400 illustrated by FIG. 4D.

In accordance with one variation of the embodiment of FIGS. 4A-4D, the GaN heterostructure 210 is modified to include an etch stop layer and a second AlGaN barrier layer between the AlGaN barrier layer 215 and the GaN cap layer 216. This embodiment is described in more detail below in connection with FIGS. 5A-5D.

FIGS. 5A-5D are cross sectional views of a sensor 500 during various processing steps in accordance with an alternate embodiment of the present invention.

Figure 5A:
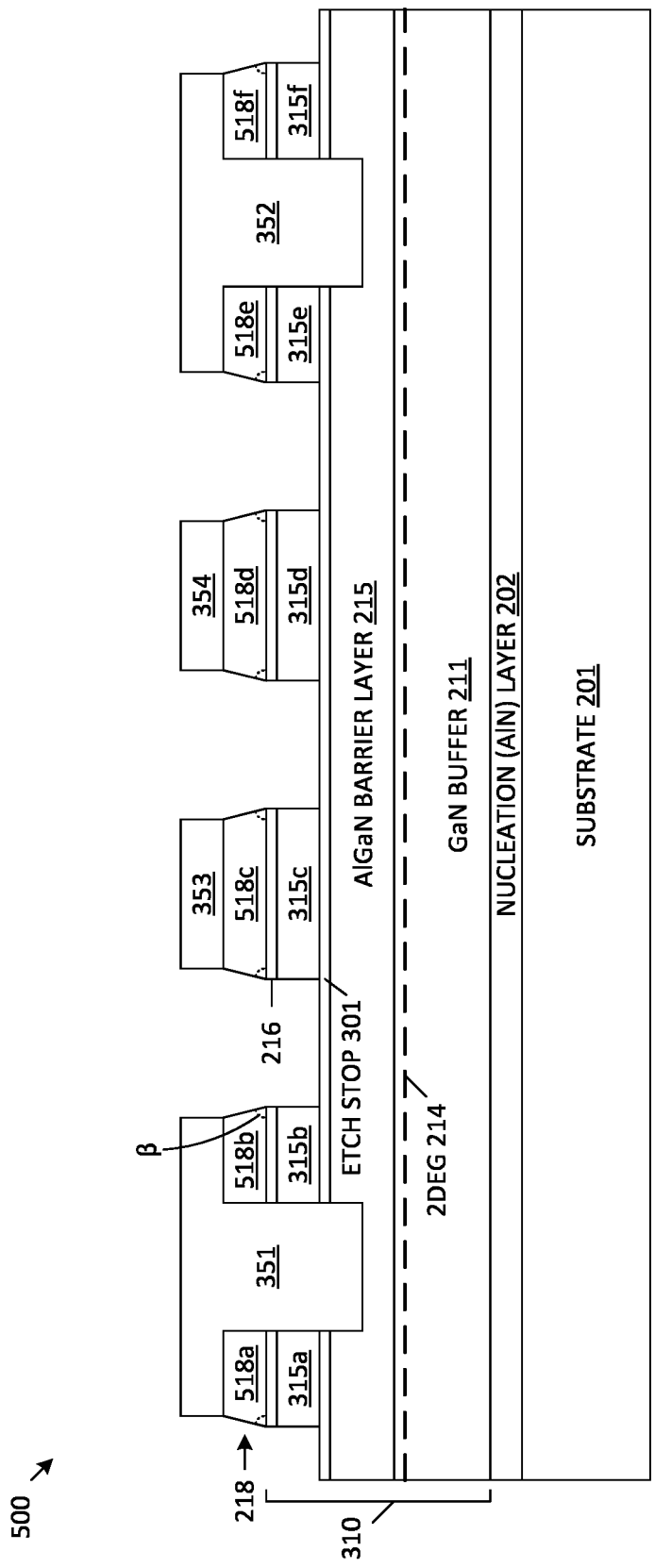
FIGS. 5A, 5B, 5C and 5D are cross sectional views of a GaN sensor, which includes dielectric sidewall spacers and an etch stop layer, during various processing steps in accordance with an alternate embodiment of the present invention.

As illustrated by FIG. 5A, sensor 500 (during an initial processing step) includes substrate 201, nucleation layer 202, GaN buffer 211, 2DEG channel 214, AlGaN barrier layer 215, etch stop layer 301, AlGaN barrier layer regions 315a-315f, GaN cap layer 216, gate dielectric layer 218, and metal structures 351-354, which are described in detail above in connection with FIGS. 3A-3I. Note that the mask 222 of FIG. 3I is stripped in FIG. 5A. As illustrated by FIG. 5A, the $SF_6$ plasma etch performed through gate dielectric layer 218 (see, e.g., FIG. 3H) is controlled to create gate dielectric regions 518a-518f. The RF power and pressure of the $SF_6$ plasma etch is tuned, and the $SF_6$ etchant flow is controlled such that the edges of gate dielectric regions 518a-518f are sloped at an angle (β) with respect to the upper surface of the AlGaN barrier layer 215. In a particular embodiment, this angle (β) is about 90 degrees. In an alternate embodiment, this angle (β) is an acute angle greater than 70 degrees. The sloped edges of the gate dielectric regions 518a-518f improve the sidewall coverage of the subsequently formed dielectric spacers 501-508, and also increase the distance (and the amount of dielectric material present) between the edges of the remaining metal structures 351-354 and the AlGaN barrier layer 215. This advantageously reduces current leakage from the metal structures 351-354 to the underlying 2DEG channel 214, thereby maintaining a stable transistor structure.

Figure 5B:
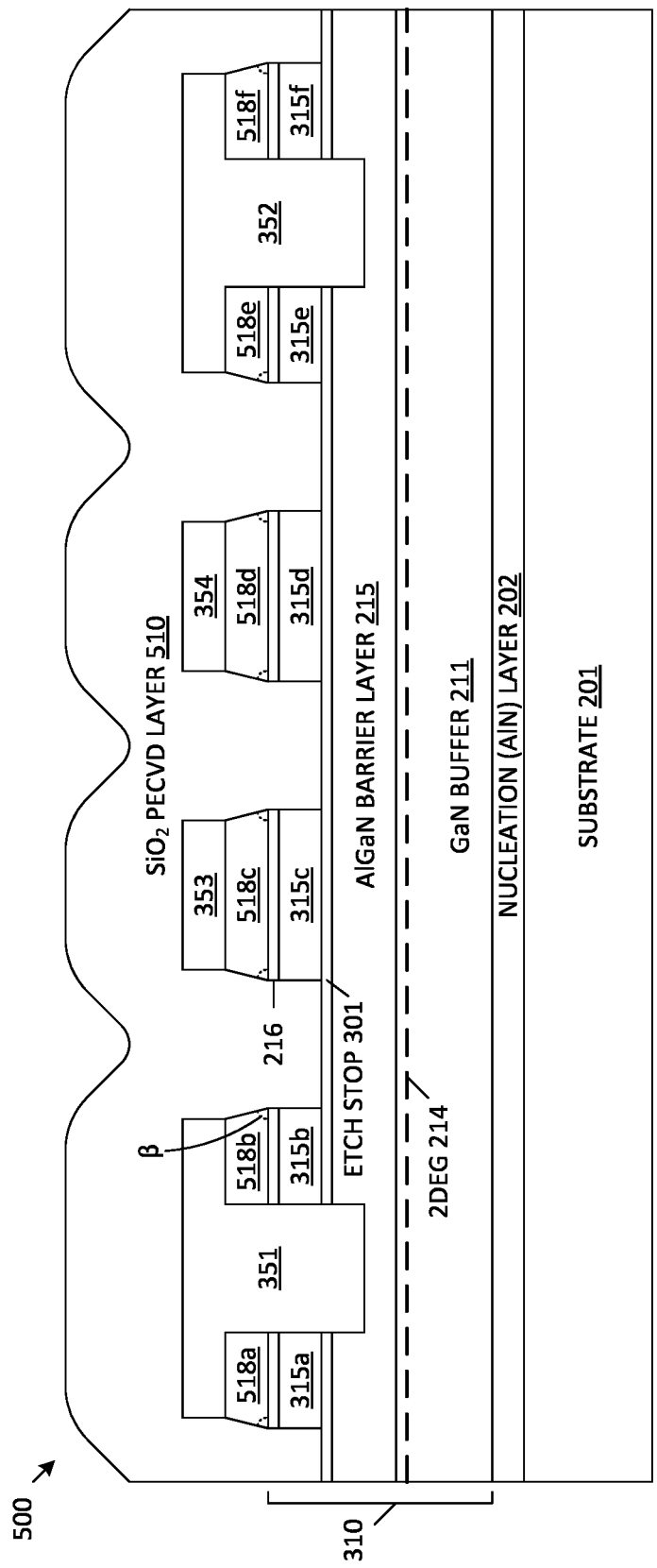

As illustrated in FIG. 5B, a dielectric layer 510 is formed over the upper surface of the resulting structure. In one embodiment, dielectric layer 510 is a silicon oxide ($SiO_2$) layer deposited using a plasma enhanced chemical vapor deposition (PECVD) process. In one embodiment, dielectric layer 510 has a thickness in the range of about 0.05 to 0.5 microns.

Figure 5C:
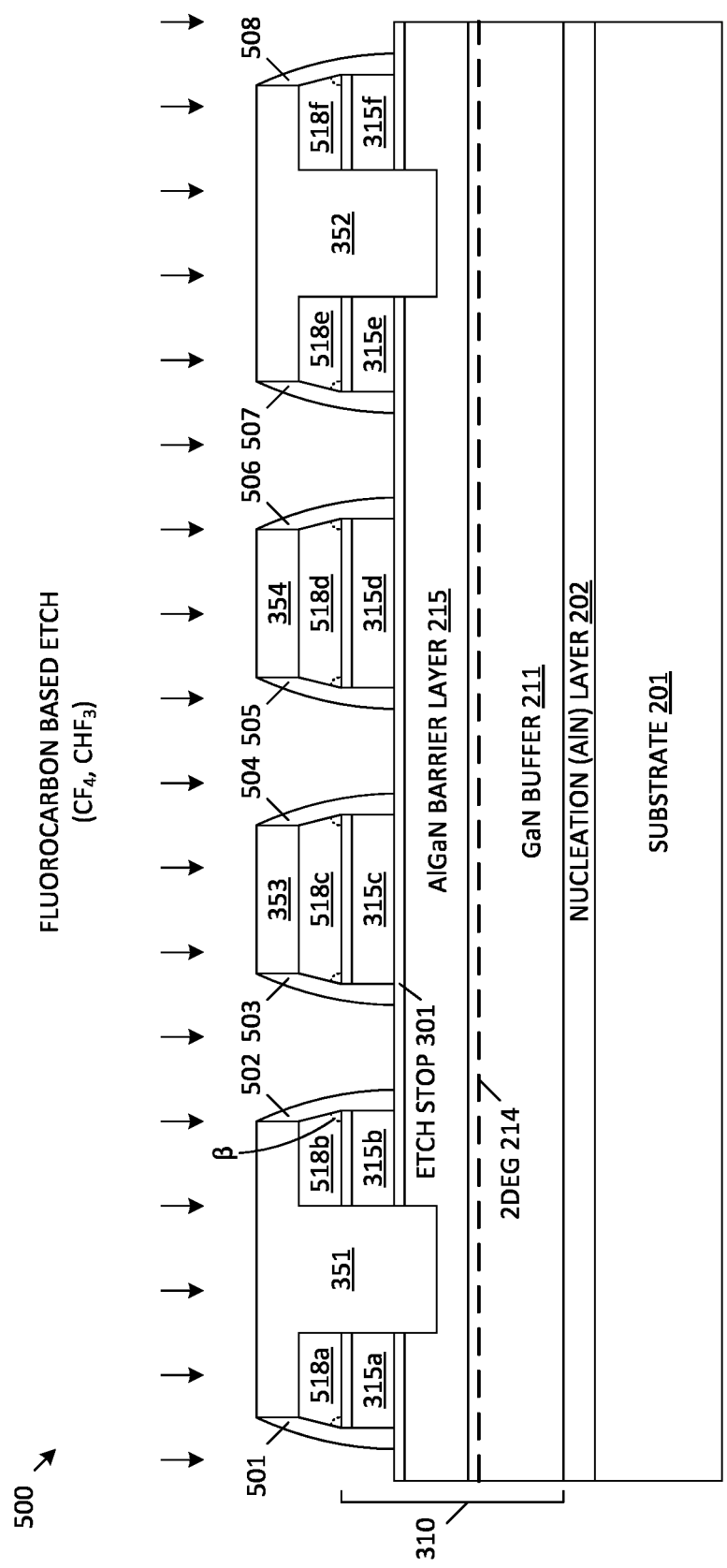

As illustrated in FIG. 5C, an anisotropic etch is performed without a mask, using a fluorocarbon-based chemistry such as $CF_4$ and $CHF_3$, thereby forming dielectric sidewall spacers 501-508 on the sidewalls of metal structures 351-354. The dielectric sidewall spacers 501-508 advantageously isolate the edges of metal structures 351-354 from AlGaN barrier layer 215, thereby preventing leakage currents from the gate electrodes 353-354 to the 2DEG conductive channel 214 during normal operation of the sensor 500.

Figure 5D:
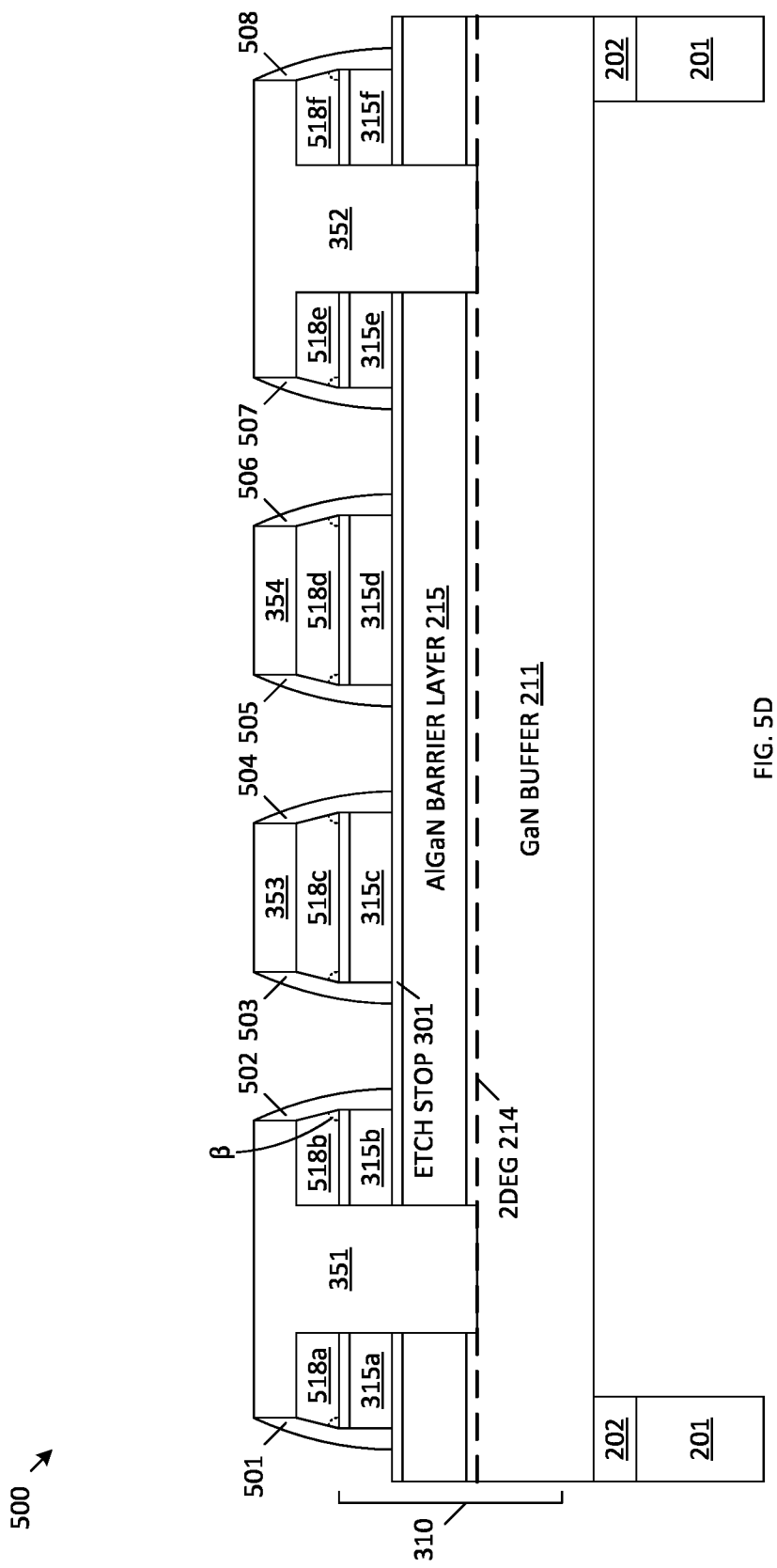

As illustrated in FIG. 5D, the rapid thermal processing (RTP) of FIG. 3J is performed (whereby the metal structures 351-352 are extended into electrical contact with the underlying 2DEG region 214 in the manner described above), and the dry etch of FIG. 3K and the wet etches of FIG. 3L are performed (thereby forming the thin membrane region 224 in the manner described above). Mask 223 and temporary protective film 225 are then removed, resulting in the sensor 500 illustrated by FIG. 5D.

Figure 6:
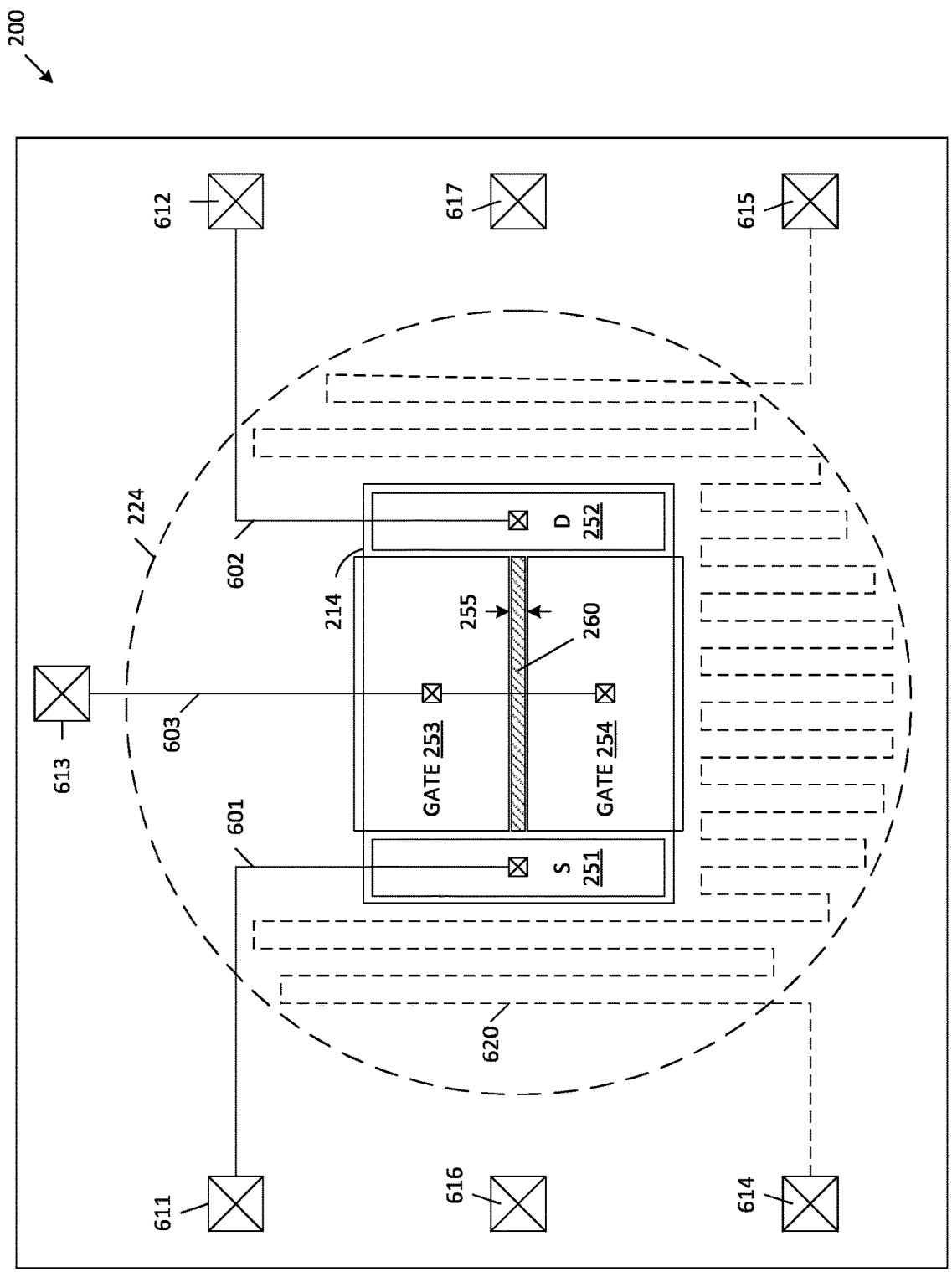
FIG. 6 is a top view of a sensor including a 2DEG resistor in accordance with various embodiments of the present invention.

FIG. 6 is a top view of sensor 200 in accordance with one embodiment of the present invention. Although sensor 200 is illustrated in FIG. 6, it is understood that sensors 300, 400 and 500 may have similar layouts in various embodiments of the present invention. FIG. 6 illustrates source and drain contacts 251 and 252, gate electrodes 253-254, 2DEG channel 214 and membrane region 224, which have been described above in connection with FIGS. 2A-2K. The gate electrodes 253 and 254 are separated by a gap 255, which defines a sensing region of the sensor 200. In one embodiment, gap 255 has a width in a range of about 0.1 to 100 microns. Although the described sensor 200 includes two gate electrodes with one corresponding gap/sensing region, it is understood that in other embodiments, the sensor can be modified to include more than two gate electrodes and a plurality of parallel corresponding gaps/sensing regions. The layout and operation of the sensor of FIG. 6 is described in more detail in co-owned U.S. Pat. No. 11,522,079 B2, which is hereby incorporated by reference in its entirety.

As illustrated by FIG. 6, a functionalization layer 260 can be formed over the exposed surface of the AlGaN layer 215 in the sensing region within the gap 255. In one embodiment, functionalization layer 260 is formed by sputtering or CVD of metal oxides using resist liftoff methods. The functionalization layer 260 can include, for example, nanoparticle surface structures (e.g., platinum or palladium nanodots, a high resistance ultrathin film deposited on the exposed surfaces of AlGaN barrier layer 215, a porous dielectric layer having a thickness in the range of about 100 Angstroms to 1 micron, or a non-conductive metal oxide layer. Functionalization layer 260 can include other materials in other embodiments, depending upon the particular application of sensor 200. For example, modification from solutions with cross-liners (organic molecules attached to the surface and having two ends, e.g., intended for protein-to-protein interaction in biology). Surface modification may be obtained also by spin coating. Inkjet printing of materials is also an option. In general, the functionalization layer 260 facilitates the sensing of the particular environmental influence to be monitored. Although functionalization layer 260 is shown in combination with the structure of the sensor 200 of FIGS. 2A-2K, it is understood that in other embodiments, the functionalization layer 260 can be located on the exposed portions of AlGaN barrier layer 215 in sensors 300, 400 and 500.

The source contact 251 is connected to a metal trace 601, the drain contact 252 is connected to a metal trace 602, and gate electrodes 253-254 are commonly connected to a metal trace 603, wherein metal traces 601-603 are fabricated over the upper surface of sensor 201. Metal traces 601-603 are also connected to metal contacts 611-613, respectively, which are located outside the perimeter of membrane 224. Although membrane 224 is illustrated as a circle in FIG. 6, it is understood that membrane 224 can have other shapes in other embodiments.

A 2DEG resistor 620 is formed using device 2DEG channel region 214 at the interface with the buffer 211, outside the view of FIGS. 2A-2K. In one embodiment, the 2DEG resistor 620 is isolated from other 2DEG channel region 214 by implanting ions of an inert gas (e.g., Ar, N) into the regions of GaN buffer 211 where the 2DEG resistor 620 and the 2DEG channel region 214 are not located, thereby eliminating the 2DEG conduction channel in these regions. This implantation is performed using an implant mask (not shown).

In the illustrated embodiment, the 2DEG resistor 620 follows a serpentine path over the membrane region 224. The ends of 2DEG resistive element 620 are connected to a first contact 614 and a second contact 615. When a voltage is applied across the contacts 614 and 615, a current flows through the 2DEG resistive element 620, thereby generating heat, which can be used to eliminate charge build-up in the 2DEG channel region 214. That is, 2DEG resistive element 260 functions as a heating element, which enables thermal refresh of the sensor 200. As described above, membrane region 224 advantageously exhibits a relatively low thermal mass, thereby allowing heat generated by passing current through the 2DEG resistor 620 to effectively heat, and eliminate charge from, 2DEG channel region 214. In an alternate embodiment, 2DEG resistor 620 can be replaced with a polysilion or metal trace, which is formed over the upper surface of sensor 200.

Contacts 616-617 provide electrical connections to the GaN buffer 211. In one embodiment, contacts 616-617 extend through AlGaN layer 215 from the front side of the sensor 200 (outside the view of FIGS. 2A-2K). In an alternate embodiment, contacts 616-617 extend through substrate 201 and nucleation layer 202 from the back side of the sensor 200 (outside the view of FIGS. 2A-2K).

Contacts 611-617 allow the required operating voltages to be applied to sensor 200 during sensing operations and refresh operations.

During sensing operations, a desired source-to-drain voltage ($V_{DS}$) is applied across source contact 611 and drain contact 612, a desired gate voltage VG is applied to gate contact 613, and the contacts 616-617 are left floating. The contacts 614-615 to the 2DEG resistor 620 are also left floating (i.e., the heater is disconnected) during the sensing operations. Under these conditions, the transistor structure of sensor 200 operates in a subthreshold mode, and the current flow between the source and drain contacts 611-612 is monitored, wherein this current flow is sensitive to the presence or absence of an external influence (e.g., chemical, radiation, etc.) in the sensing region 255 of the sensor 200.

Sensor 200 implements thermal refresh operations in the following manner. Contact 614 is grounded and a high positive voltage (e.g., 5 to 50 Volts) is applied to contact 615 and also to contacts 616-617. The current forced through 2DEG resistor 620 is high enough to generate the heat necessary to eliminate excess holes from the 2DEG channel region 214.

In another embodiment, sensor 200 may implement electrical refresh at the same time as the thermal refresh. Electrical refresh is implemented by disconnecting (floating) the source contact 611, connecting the drain contact 612 to ground, and applying a high voltage to contacts 616-617.

In the manner described above, sensor 200 (as well as sensors 300, 400 and 500) operates in a subthreshold region using a depletion-type MIS HEMT structure, using a geometry where one or more narrow sensing regions between long gate electrodes fully control the current flow. In areas under the gate electrodes 253-254, current flow is blocked when a negative voltage exceeding the threshold voltage Vt is applied to the gate electrodes, while fringing electric fields enable subthreshold current flow in the 2DEG channel 214 below the sensing region 255.

In the manner described above, GaN sensors of the present invention can be readily integrated into conventional CMOS fabrication processes because of the simple construction of these sensors, and due to relatively low risk of metal contamination in the fabrication process. In addition, the sloped profiles of gate dielectric structures 218a-218f (sensors 200 and 300) and the insulation provided by dielectric sidewall spacers 401-408 (sensors 400 and 500) advantageously prevent leakage paths between the metal gates and the 2DEG channel region 214, thereby resulting in enhanced stability and reliability. In addition, the use of AlGaN layer 315 and etch stop layer 301 (sensors 300 and 500) advantageously allow the thickness of the AlGaN layer 215 in the sensing regions to be precisely controlled. In addition, sensors of the present invention can be easily refreshed to compensate for charge build-up in GaN layer 111.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A gallium nitride (GaN) based sensor comprising:
   a GaN hetero-structure that comprises a GaN layer and a first barrier layer located over the GaN layer, wherein a 2-dimensional electron gas (2DEG) channel is located at an upper surface of the GaN layer, adjacent to the first barrier layer;
   a plurality of dielectric structures located over the GaN hetero-structure;
   a source contact that extends through a first one of the plurality of dielectric structures and the first barrier layer to contact the 2DEG channel;
   a drain contact that extends through a second one of the plurality of dielectric structures and the first barrier layer to contact the 2DEG channel; and
   a plurality of gate electrodes that extend over corresponding ones of the plurality of dielectric structures and the 2DEG channel, wherein the gate electrodes are located between the source contact and the drain contact;
   wherein the source contact, the drain contact and the gate electrodes have sidewalls that are vertical with respect to an upper surface of the first barrier layer, and each of the plurality of dielectric structures have sidewalls that are sloped at an acute angle with respect to the upper surface of the first barrier layer.

2. The sensor of claim 1, wherein the first barrier layer is thinned in regions located between the plurality of dielectric structures.

3. The sensor of claim 1, wherein the first barrier layer comprises aluminum gallium nitride (AlGaN).

4. The sensor of claim 1, wherein the GaN hetero-structure is located over a substrate.

5. The sensor of claim 4, wherein a portion of the substrate is removed under the 2DEG channel, thereby defining a membrane region of the sensor.

6. The sensor of claim 5, further comprising a 2-dimensional electron gas (2DEG) resistor located in the GaN layer, wherein the 2DEG resistor is located in the membrane region.

7. The sensor of claim 1, wherein the source contact, the drain contact and the gate electrodes comprise metal.

8. The sensor of claim 1, where the GaN hetero-structure further comprises an etch stop layer located over the first barrier layer, and a second barrier layer located over the etch stop layer, wherein the second barrier layer is removed in regions located between the plurality of dielectric structures.

9. The sensor of claim 8, wherein the first barrier layer comprises aluminum gallium nitride having a first composition, and the etch stop layer comprises aluminum gallium nitride having a second composition, wherein the first composition is different than the second composition.

10. The sensor of claim 9, wherein the second barrier layer comprises aluminum gallium nitride having a third composition wherein the second composition is different than the third composition.

11. The sensor of claim 1, wherein the plurality of dielectric structures comprise silicon nitride.

12. The sensor of claim 1, wherein the acute angle is greater than 20 degrees.

13. The sensor of claim 1, wherein the acute angle is less than 70 degrees.

14. The sensor of claim 1, further comprising dielectric spacers located adjacent to the sidewalls of the source contact, drain contact and gate electrodes.

15. The sensor of claim 14, wherein portions of the dielectric spacers are located adjacent to the sidewalls of the plurality of dielectric structures.

16. The sensor of claim 15, wherein the acute angle is greater than 70 degrees.

17. The sensor of claim 1, wherein a pair of the plurality of gate electrodes are separated by a gap that defines a sensing region of the sensor.

18. The sensor of claim 17, wherein the sensing region is located between the source contact and the drain contact.

19. The sensor of claim 17, further comprising a functionalization layer located over the GaN heterostructure in the sensing region, wherein the functionalization layer aids in the detection of an external influence.

20. The sensor of claim 1, further comprising contacts that provide electrical connections to the GaN layer.

21. A gallium nitride (GaN) based sensor comprising:
   a GaN hetero-structure that comprises a GaN layer and a first barrier layer located over the GaN layer, wherein a 2-dimensional electron gas (2DEG) channel is located at an upper surface of the GaN layer, adjacent to the first barrier layer;
   a plurality of dielectric structures located over the GaN hetero-structure;
   a source contact that extends through a first one of the plurality of dielectric structures and the first barrier layer to contact the 2DEG channel;
   a drain contact that extends through a second one of the plurality of dielectric structures and the first barrier layer to contact the 2DEG channel; and
   a plurality of gate electrodes that extend over corresponding ones of the plurality of dielectric structures and the 2DEG channel, wherein the gate electrodes are located between the source contact and the drain contact,
   wherein the source contact, the drain contact, the gate electrodes and the plurality of dielectric structures have sidewalls that are vertical with respect to an upper surface of the first barrier layer; and
   dielectric spacers located immediately adjacent to the sidewalls of the source contact, the drain contact, the gate electrodes and the plurality of dielectric structures.

22. The sensor of claim 21, wherein the first barrier layer is thinned in regions located between the plurality of dielectric structures.

23. The sensor of claim 21, wherein the first barrier layer comprises aluminum gallium nitride (AlGaN).

24. The sensor of claim 21, wherein the GaN hetero-structure is located over a substrate.

25. The sensor of claim 24, wherein a portion of the substrate is removed under the 2DEG channel, thereby defining a membrane region of the sensor.

26. The sensor of claim 25, further comprising a two-dimensional electron gas (2DEG) resistor located in the GaN layer, wherein the 2DEG resistor is located in the membrane region.

27. The sensor of claim 21, wherein the source contact, the drain contact and the gate electrodes comprise metal.

28. The sensor of claim 21, where the GaN heterostructure further comprises an etch stop layer located over the first barrier layer, and a second barrier layer located over the etch stop layer, wherein the second barrier layer is removed in regions located between the plurality of dielectric structures.

29. The sensor of claim 28, wherein the first barrier layer comprises aluminum gallium nitride having a first composition, and the etch stop layer comprises aluminum gallium nitride having a second composition, wherein the first composition is different than the second composition.

30. The sensor of claim 29, wherein the second barrier layer comprises aluminum gallium nitride having a third composition wherein the second composition is different than the third composition.

31. The sensor of claim 21, wherein a pair of the plurality of gate electrodes are separated by a gap that defines a sensing region of the sensor.

32. The sensor of claim 31, wherein the sensing region is located between the source contact and the drain contact.

33. The sensor of claim 21, further comprising a functionalization layer located over the GaN heterostructure in the sensing region, wherein the functionalization layer aids in the detection of an external influence.

* * * * *